(12) United States Patent
Ogata et al.

(10) Patent No.: US 12,375,055 B2
(45) Date of Patent: Jul. 29, 2025

(54) FILTER DEVICE AND RADIO FREQUENCY FRONT-END CIRCUIT INCLUDING THE SAME

(71) Applicant: Murata Manufacturing Co., Ltd., Nagaokakyo (JP)

(72) Inventors: Makoto Ogata, Nagaokakyo (JP); Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 503 days.

(21) Appl. No.: 17/970,650

(22) Filed: Oct. 21, 2022

(65) Prior Publication Data

US 2023/0044655 A1  Feb. 9, 2023

Related U.S. Application Data

(63) Continuation of application No. PCT/JP2021/025591, filed on Jul. 7, 2021.

(30) Foreign Application Priority Data

Jul. 20, 2020 (JP) ................. 2020-123702
Aug. 26, 2020 (JP) ................. 2020-142400
Mar. 10, 2021 (JP) ................. 2021-038540

(51) Int. Cl.
  *H03H 7/01* (2006.01)
  *H01F 27/28* (2006.01)
  *H01G 4/30* (2006.01)

(52) U.S. Cl.
  CPC ....... *H03H 7/0115* (2013.01); *H01F 27/2804* (2013.01); *H01G 4/30* (2013.01); *H01F 2027/2809* (2013.01)

(58) Field of Classification Search
  CPC ...... H03H 7/0115; H03H 7/01; H03H 7/0123; H03H 7/0138; H03H 7/0153; H03H 7/0161
  (Continued)

(56) References Cited

U.S. PATENT DOCUMENTS

2012/0313730 A1  12/2012  Ootsuka
2017/0093358 A1  3/2017  Imamura
(Continued)

FOREIGN PATENT DOCUMENTS

JP    09-121134 A    5/1997
JP    2017-063394 A   3/2017
(Continued)

OTHER PUBLICATIONS

International Search Report in PCT/JP2021/025591, mailed Sep. 14, 2021, 3 pages.
(Continued)

*Primary Examiner* — Stephen E. Jones
(74) *Attorney, Agent, or Firm* — Keating & Bennett, LLP

(57) ABSTRACT

A filter device includes an input terminal, an output terminal, a main body, a common electrode provided to the main body, a ground terminal, and LC parallel resonators connected to the common electrode and the ground terminal. Each LC parallel resonator includes a capacitor, a first via, and a second via. One end of the first via is connected to the common electrode, and another end thereof is connected to the ground terminal through the capacitor. One end of the second via is connected to the common electrode, and another end thereof is connected to the ground terminal without through the capacitor. The second via is connected between portions of the common electrode to which the first vias of two adjacent resonators are connected.

20 Claims, 17 Drawing Sheets

(58) Field of Classification Search
USPC .................................................. 333/167, 175
See application file for complete search history.

(56) References Cited

U.S. PATENT DOCUMENTS

| | | | |
|---|---|---|---|
| 2019/0173447 A1* | 6/2019 | Oishi | ........................ H03H 7/09 |
| 2019/0181826 A1 | 6/2019 | Imamura | |
| 2019/0260343 A1* | 8/2019 | Shiokawa | ........... H01F 17/0013 |
| 2022/0077835 A1* | 3/2022 | Motoyama | ............... H01G 4/40 |

FOREIGN PATENT DOCUMENTS

| | | |
|---|---|---|
| JP | 2019-103108 A | 6/2019 |
| WO | 2012/033137 A1 | 3/2012 |
| WO | 2017/169354 A1 | 10/2017 |
| WO | 2019/097774 A1 | 5/2019 |

OTHER PUBLICATIONS

Written Opinion in PCT/JP2021/025591, mailed Sep. 14, 2021, 3 pages.

\* cited by examiner

FIG.26

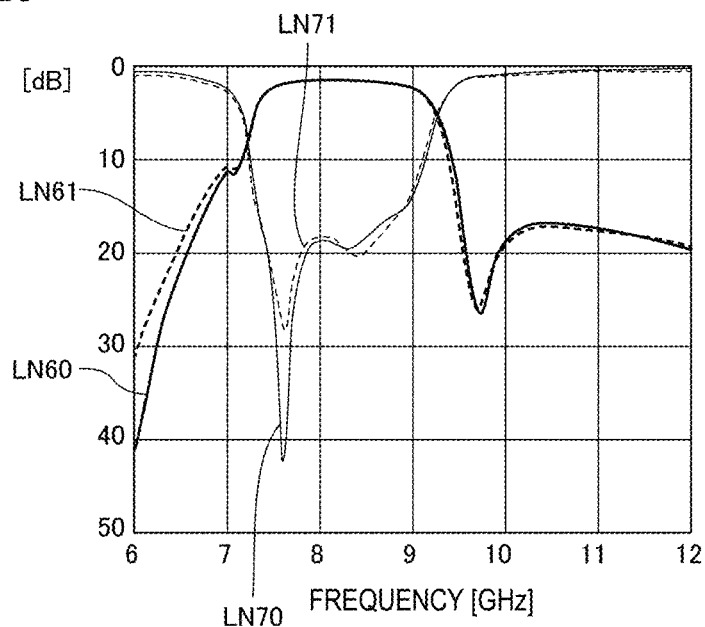

FIG.27

| | CASE 1 | CASE 2 | CASE 3 |
|---|---|---|---|
| | INTERNAL SHIELD: ABSENT COMMON ELECTRODE: ABSENT | INTERNAL SHIELD: ABSENT COMMON ELECTRODE: PRESENT | INTERNAL SHIELD: PRESENT COMMON ELECTRODE: PRESENT |
| DETERIORATION DEGREE OF PASS BAND | 0.30dB DETERIORATION | 0.30dB DETERIORATION | 0.06dB DETERIORATION |
| HIGHER SIDE ATTENUATION FREQUENCY — EXTERNAL SHIELD: ABSENT | 28.5GHz | 23.3GHz | 23.2GHz |
| HIGHER SIDE ATTENUATION FREQUENCY — EXTERNAL SHIELD: PRESENT | 24.0GHz | 24.6GHz | 24.3GHz |

FILTER DEVICE AND RADIO FREQUENCY FRONT-END CIRCUIT INCLUDING THE SAME

CROSS REFERENCE TO RELATED APPLICATIONS

This application claims the benefit of priority to Japanese Patent Application No. 2021-038540, filed on Mar. 10, 2021, Japanese Patent Application No. 2020-142400, filed on Aug. 26, 2020, and Japanese Patent Application No. 2020-123702, filed on Jul. 20, 2020, and is a Continuation Application of PCT Application No. PCT/JP2021/025591, filed on Jul. 7, 2021. The entire contents of each application are hereby incorporated herein by reference.

BACKGROUND OF THE INVENTION

1. Field of the Invention

The present disclosure relates to a filter device and a radio frequency front-end circuit including the same, and more particularly to a technique for improving characteristics of a multilayer LC filter.

2. Description of the Related Art

International Publication No. 2019/097774 discloses a multilayer band pass filter in which four stages of LC parallel resonators are located between an input terminal and an output terminal. In the band pass filter of International Publication No. 2019/097774, two capacitors (a first capacitor and a second capacitor) connected in series are formed between a resonator connected to an input terminal and a resonator connected to an output terminal, and a third capacitor is formed between a connection node of the two capacitors and a ground point. With the configuration above, a frequency of an attenuation pole on a higher side relative to a pass band may be changed without substantially changing a frequency of an attenuation pole on a lower side relative to the pass band.

An inductor defining each LC parallel resonator included in a band pass filter disclosed in International Publication No. 2019/097774 is defined by two via conductors formed in a lamination direction of dielectric substrates having a multilayer structure and a line conductor connecting the via conductors, and the line conductors of the LC parallel resonators are disposed apart from each other. Magnetic coupling between the resonators in the band pass filter described above is adjusted by changing positions (interval) of the via conductors forming the inductor or changing intervals between the resonators in most cases.

However, when the arrangement of the via conductors is changed, there is a possibility that the Q factor decreases because an air core diameter of the inductor changes. Further, when the interval between specific resonators is changed, there is a possibility that the loss increases instead, since the magnetic coupling with other resonators is also affected.

The band pass filter as described above may be used in a portable communication device represented by a mobile phone or a smartphone. In such a mobile terminal, further reduction in size and thickness is demanded. However, when the filter is reduced in size accordingly, the degree of freedom in arrangement of the via conductors is further limited, and thus it may become hard to adjust the magnetic coupling between the resonators.

SUMMARY OF THE INVENTION

Preferred embodiments of the present invention provide multistage multilayer filters each including multiple LC parallel resonators, to adjust magnetic coupling between the resonators while reducing or preventing a decrease in the Q factor.

A filter device according to a preferred embodiment of the present invention includes an input terminal, an output terminal, a main body, a common electrode provided to the main body, a ground terminal, and first to third LC parallel resonators connected to the common electrode and the ground terminal. Each resonator includes a capacitor, a first via, and a second via. One end of the first via is connected to the common electrode, and another end thereof is connected to the ground terminal through the capacitor. One end of the second via is connected to the common electrode, and another end thereof is connected to the ground terminal without passing through the capacitor. The second via is connected between portions of the common electrode to which first vias of two adjacent resonators are connected, each of the first vias being the first via including the one end connected to the common electrode and the other end connected to the ground terminal through the capacitor.

In the filter devices according to preferred embodiments of the present invention, the multiple LC parallel resonators (first LC parallel resonator to third LC parallel resonator) magnetically coupled to each other are connected by the common electrode. With the configuration above, the arrangement of the vias defining the inductor of each resonator is not limited, and the magnetic coupling between the adjacent LC parallel resonators is adjusted by a shape of the common electrode. Accordingly, in multistage LC filters, it becomes possible to adjust the magnetic coupling between resonators while reducing or preventing a decrease in the Q factor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 26 is a graph illustrating a bandpass characteristic of the filter device in FIG. 25.

FIG. 27 is a table explaining the influence of an external shield depending on the presence or absence of a common electrode and an internal shield.

DETAILED DESCRIPTION OF THE PREFERRED EMBODIMENTS

Figure 1:
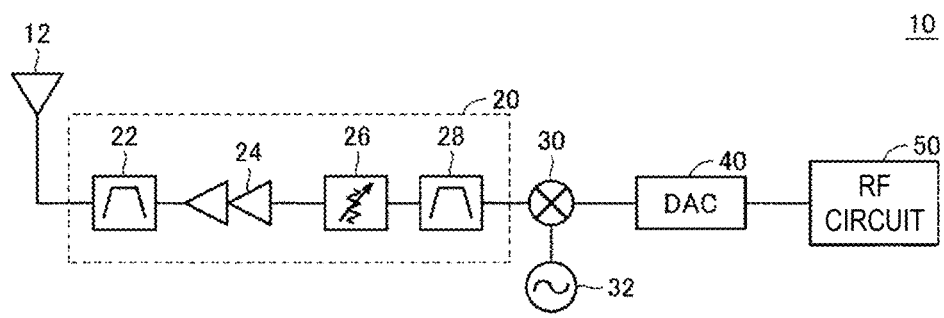
FIG. 1 is a block diagram of a communication device including a radio frequency front-end circuit in which a filter device of Preferred Embodiment 1 of the present invention is used.

Hereinafter, preferred embodiments of the present disclosure will be described in detail with reference to the drawings. In the drawings, the same or corresponding portions are denoted by the same reference signs, and a description thereof will not be repeated.

Preferred Embodiment 1

Basic Configuration of Communication Device

FIG. 1 is a block diagram of a communication device 10 including a radio frequency front-end circuit 20 in which a filter device of Preferred Embodiment 1 of the present invention is used. The communication device 10 is preferably a base station for mobile phones, for example.

Referring to FIG. 1, the communication device 10 preferably includes an antenna 12, the radio frequency front-end circuit 20, a mixer 30, a local oscillator 32, a D/A converter (DAC) 40, and an RF circuit 50. The radio frequency front-end circuit 20 includes band pass filters 22 and 28, an amplifier 24, and an attenuator 26. Although FIG. 1 illustrates a case that the radio frequency front-end circuit 20 includes a transmission circuit that transmits a radio frequency signal from the antenna 12, the radio frequency front-end circuit 20 may include a reception circuit that receives a radio frequency signal through the antenna 12.

The communication device 10 up-converts a transmission signal transferred from the RF circuit 50 into a radio frequency signal and radiates the radio frequency signal from the antenna 12. A modulated digital signal which is a transmission signal outputted from the RF circuit 50 is converted into an analog signal by the D/A converter 40. The mixer 30 mixes the transmission signal, which is converted from a digital signal to an analog signal by the D/A converter 40, with an oscillation signal from the local oscillator 32 to up-convert into a radio frequency signal. The band pass filter 28 removes an unnecessary wave generated by the up-conversion and extracts only a transmission signal in a desired frequency band. The attenuator 26 adjusts the strength of the transmission signal. The amplifier 24 amplifies the power of the transmission signal that has passed through the attenuator 26 to a predetermined level. The band pass filter 22 removes an unnecessary wave generated in the amplification process and passes only a signal component in a frequency band regulated by a communication standard. The transmission signal that has passed through the band pass filter 22 is radiated from the antenna 12.

As the band pass filters 22 and 28 in the communication device 10 as described above, a filter device corresponding to the present invention may be adopted.

Configuration of Filter Device

Next, a detailed configuration of a filter device 100 of Preferred Embodiment 1 will be described with reference to FIG. 2 to FIG. 5.

Figure 2:
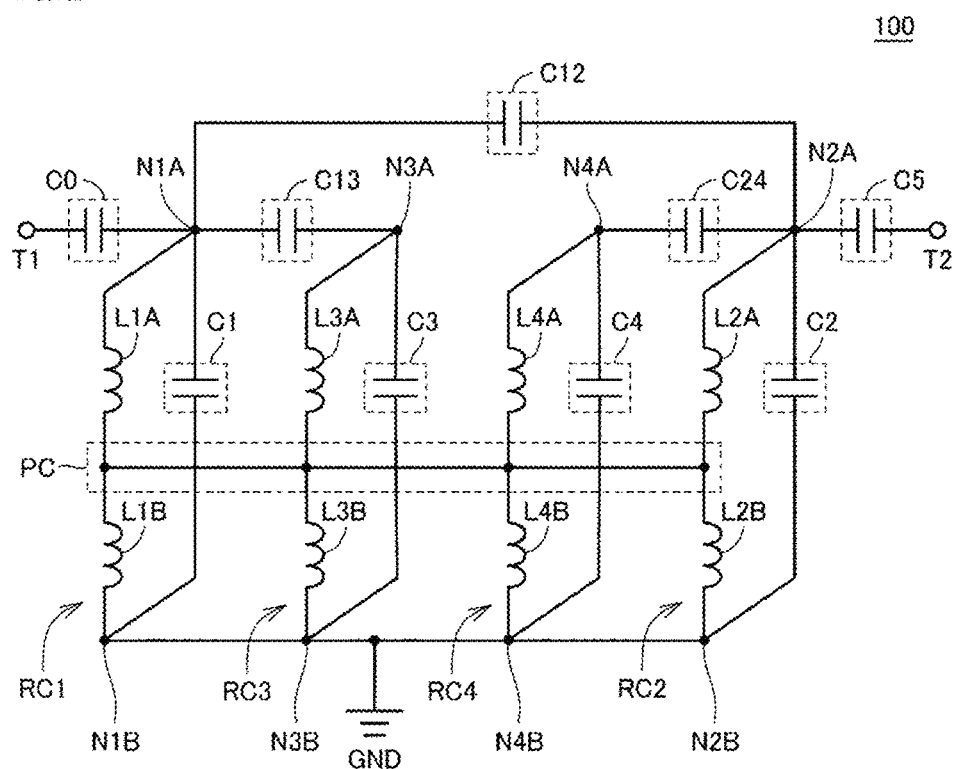
FIG. 2 is an equivalent circuit diagram of the filter device of Preferred Embodiment 1 of the present invention.

FIG. 2 is an equivalent circuit diagram of the filter device 100. Referring to FIG. 2, the filter device 100 includes an input terminal T1, an output terminal T2, and resonators RC1 to RC4. Each of the resonators RC1 to RC4 is an LC parallel resonator in which inductors and a capacitor are connected in parallel.

The resonator RC1 includes inductors L1A and L1B connected in series and a capacitor C1 connected in parallel with the inductors L1A and L1B. A connection node N1A between the inductor L1A and the capacitor C1 is connected to the input terminal T1 through a capacitor C0. A connection node N1B between the inductor L1B and the capacitor C1 is connected to a ground terminal GND.

The resonator RC2 includes inductors L2A and L2B connected in series and a capacitor C2 connected in parallel with the inductors L2A and L2B. A connection node N2A between the inductor L2A and the capacitor C2 is connected to the output terminal T2 through a capacitor C5. A connection node N2B between the inductor L2B and the capacitor C2 is connected to the ground terminal GND.

The resonator RC3 includes inductors L3A and L3B connected in series and a capacitor C3 connected in parallel with the inductors L3A and L3B. A connection node N3A between the inductor L3A and the capacitor C3 is connected to the connection node N1A of the resonator RC1 through a capacitor C13. A connection node N3B between the inductor L3B and the capacitor C3 is connected to the ground terminal GND.

The resonator RC4 includes inductors L4A and L4B connected in series and a capacitor C4 connected in parallel with the inductors L4A and L4B. A connection node N4A between the inductor L4A and the capacitor C4 is connected to the connection node N2A of the resonator RC2 through a capacitor C24. A connection node N4B between the inductor L4B and the capacitor C4 is connected to the ground terminal GND.

Further, the connection node N1A of the resonator RC1 and the connection node N2A of the resonator RC2 are connected through a capacitor C12. Furthermore, connection nodes of the two inductors in the resonators are connected to each other. The portion at which the resonators are connected in common corresponds to a common electrode PC, which will be described later with reference to FIG. 4 or the like.

The resonators are coupled to each other by magnetic coupling. As described above, the filter device 100 has a configuration in which four stages of resonators magnetically coupled to each other are between the input terminal T1 and the output terminal T2. By adjusting a resonant frequency of each resonator, the filter device 100 functions as a band pass filter that passes a signal in a desired frequency band.

The capacitor C0 connected to the input terminal T1 and the capacitor C5 connected to the output terminal T2 are not specifically required, and the resonators RC1 and RC2 may be directly connected to the input terminal T1 and the output terminal T2, respectively.

Figure 3:
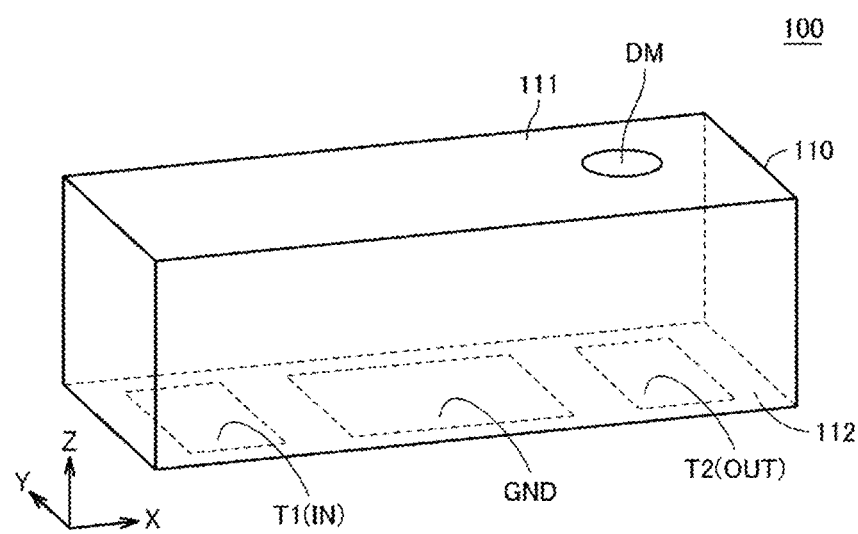
FIG. 3 is an external perspective view of the filter device in FIG. 2.
Figure 4:
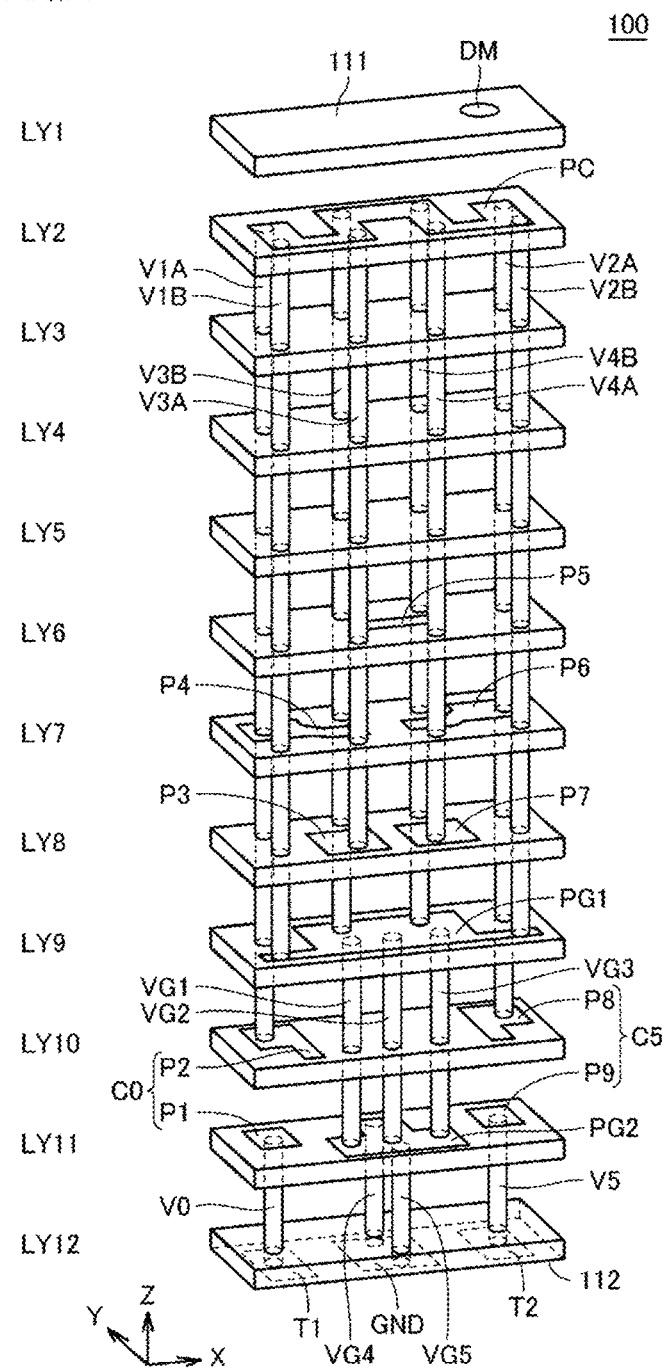
FIG. 4 is an exploded perspective view of the filter device in FIG. 2 illustrating an example of a multilayer structure thereof.

FIG. 3 is an external perspective view of the filter device 100, and FIG. 4 is an exploded perspective view of the filter device 100 illustrating an example of a multilayer structure thereof.

Referring to FIG. 3 and FIG. 4, the filter device 100 preferably includes a rectangular or substantially rectangular parallelepiped main body 110 formed by laminating multiple dielectric layers LY1 to LY12 in a lamination direction. The dielectric layers LY1 to LY12 are made of a ceramic such as a low temperature co-fired ceramic (LTCC) or a resin, for example. In the main body 110, an inductor and a capacitor defining an LC resonant circuit are defined by multiple electrodes provided on the respective dielectric layers and multiple vias provided between the dielectric layers. In this description, the term "via" refers to a conductor provided in a dielectric layer in order to connect electrodes provided on different dielectric layers. The via is made of conductive paste, plating, and/or a metal pin, for example.

In the following description, a lamination direction of the dielectric layers LY1 to LY12 in the main body 110 is referred to as a "Z-axis direction"; in directions orthogonal or substantially orthogonal to the Z-axis direction, a direction extending along a long side of the main body 110 is referred to as an "X-axis direction", and a direction extending along a short side of the main body 110 is referred to as a "Y-axis direction". Hereinafter, in the Z-axis in each drawing, a positive direction may be referred to as an upper side, and a negative direction may be referred to as a lower side.

A direction mark DM for specifying the direction of the filter device 100 is provided on an upper surface 111 (first layer LY1) of the main body 110. External terminals (input terminal T1, output terminal T2, and ground terminal GND) for connecting the filter device 100 to an external device are located on a lower surface 112 (twelfth layer LY12) of the main body 110. The input terminal T1, the output terminal T2, and the ground terminal GND each are flat plate-shaped electrodes, and are land grid array (LGA) terminals regularly arranged on the lower surface 112 of the main body 110.

As described with reference to FIG. 2, the filter device 100 preferably includes four stages of LC parallel resonators. More specifically, the four stages of LC parallel resonators include the resonator RC1 including vias V1A and V1B and a capacitor electrode P2, the resonator RC2 including vias V2A and V2B and a capacitor electrode P8, the resonator RC3 including vias V3A and V3B and a capacitor electrode P3, and the resonator RC4 including vias V4A and V4B and a capacitor electrode P7.

The capacitor electrode P2 of the resonator RC1 and the capacitor electrode P8 of the resonator RC2 are provided on the tenth layer LY10. The capacitor electrode P2 opposes a plate electrode P1 provided on the eleventh layer LY11. The capacitor electrode P2 and the plate electrode P1 define the capacitor C0 in FIG. 2. The plate electrode P1 is connected to the input terminal T1 provided on the twelfth layer LY12 by a via V0.

The capacitor electrode P8 opposes a plate electrode P9 provided on the eleventh layer LY11. The capacitor electrode P8 and the plate electrode P9 define the capacitor C5 in FIG. 2. The plate electrode P9 is connected to the output terminal T2 provided on the twelfth layer LY12 by a via V5.

The capacitor electrode P2 of the resonator RC1 is connected to the common electrode PC provided on the second layer LY2 by the via V1A. The common electrode PC is connected to a plate electrode PG1 provided on the ninth layer LY9 by the via V1B. The plate electrode PG1 is connected to a plate electrode PG2 provided on the eleventh layer LY11 by vias VG1, VG2, and VG3. Further, the plate electrode PG2 is connected to the ground terminal GND provided on the twelfth layer LY12 by vias VG4 and VG5. Part of the capacitor electrode P2 also opposes the plate electrode PG1, and the capacitor electrode P2 and the plate electrode PG1 define the capacitor C1 in FIG. 2. The via V1A and the via V1B respectively correspond to the inductor L1A and the inductor L1B in FIG. 2.

The capacitor electrode P8 of the resonator RC2 is connected to the common electrode PC provided on the second layer LY2 by the via V2A. The common electrode PC is connected to the plate electrode PG1 provided on the ninth layer LY9 by the via V2B. Part of the capacitor electrode P8 also opposes the plate electrode PG1, and the capacitor electrode P8 and the plate electrode PG1 define the capacitor C2 in FIG. 2. The via V2A and the via V2B respectively correspond to the inductor L2A and the inductor L2B in FIG. 2.

The capacitor electrode P3 of the resonator RC3 and the capacitor electrode P7 of the resonator RC4 are provided on the eighth layer LY8. The capacitor electrode P3 is connected to the common electrode PC provided on the second layer LY2 by the via V3A. The common electrode PC is connected to the plate electrode PG1 provided on the ninth layer LY9 by the via V3B. The capacitor electrode P3 opposes the plate electrode PG1, and the capacitor electrode P3 and the plate electrode PG1 define the capacitor C3 in FIG. 2. The via V3A and the via V3B respectively correspond to the inductor L3A and the inductor L3B in FIG. 2.

The capacitor electrode P7 is connected to the common electrode PC provided on the second layer LY2 by the via V4A. The common electrode PC is connected to the plate electrode PG1 provided on the ninth layer LY9 by the via V4B. The capacitor electrode P7 opposes the plate electrode PG1, and the capacitor electrode P7 and the plate electrode PG1 define the capacitor C4 in FIG. 2. The via V4A and the via V4B respectively correspond to the inductor L4A and the inductor L4B in FIG. 2.

The via V1A of the resonator RC1 is also connected to a plate electrode P4 provided on the seventh layer LY7. Part of the plate electrode P4 opposes the capacitor electrode P3 of the resonator RC3. The plate electrode P4 and the capacitor electrode P3 define the capacitor C13 in FIG. 2.

The via V2A of the resonator RC2 is also connected to a plate electrode P6 provided on the seventh layer LY7. Part of the plate electrode P6 opposes the capacitor electrode P7 of the resonator RC4. The plate electrode P6 and the capacitor electrode P7 define the capacitor C24 in FIG. 2.

Further, a portion of the plate electrode P4 and a portion of the plate electrode P6 oppose a plate electrode P5 provided on the sixth layer LY6. The plate electrode P4 to P6 define the capacitor C12 in FIG. 2.

In the following description, each of the vias V1A, V2A, V3A, and V4A in the resonators connected to the ground terminal GND through the capacitor will be referred to as a "first via". Further, each of the vias V1B, V2B, V3B, and V4B in the resonators connected to the ground terminal GND without through the capacitor will be referred to as a "second via".

Figure 5:
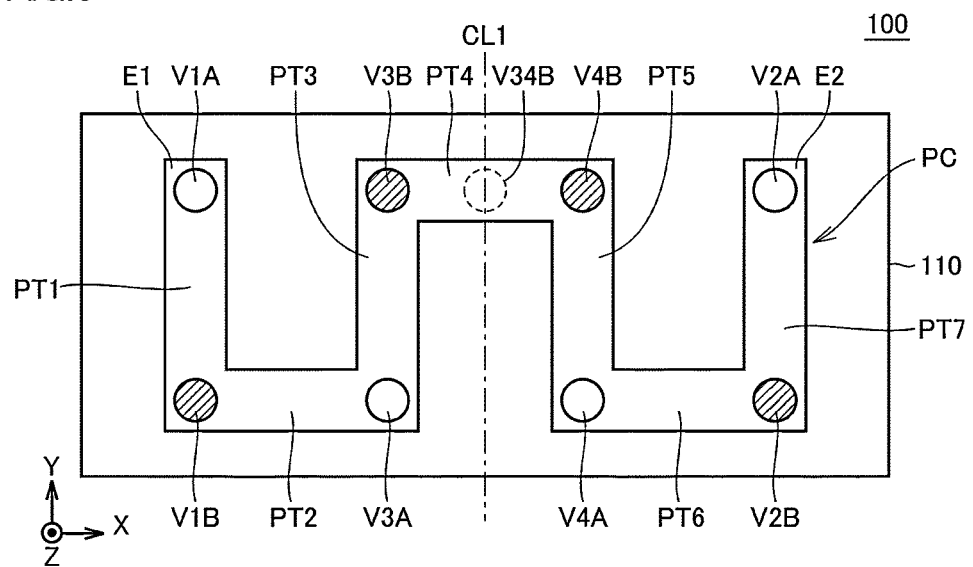
FIG. 5 is a plan view of a common electrode of the filter device in FIG. 2.

FIG. 5 is a plan view of the common electrode PC in the filter device 100. The common electrode PC is preferably defined by, for example, a strip-shaped wiring pattern including a first end portion E1 and a second end portion E2. In FIG. 5, the common electrode PC preferably has, for example, a meandering or serpentine shape in which wiring patterns PT1, PT3, PT5, and PT7 along the short side (Y-axis) of the main body 110 and wiring patterns PT2, PT4, and PT6 along the long side (X-axis) of the main body 110 are alternately connected. Line widths of the wiring patterns PT1 to PT7 are the same or substantially the same.

The via V1A of the resonator RC1 is connected to the first end portion E1 of the common electrode PC (that is, one end of the wiring pattern PT1). The via V1B of the resonator RC1 is connected to the other end of the wiring pattern PT1 (that is, one end of the wiring pattern PT2). The via V3A of the resonator RC3 is connected to the other end of the wiring pattern PT2 (that is, one end of the wiring pattern PT3). The via V3B of the resonator RC3 is connected to the other end of the wiring pattern PT3 (that is, one end of the wiring pattern PT4).

The via V4B of the resonator RC4 is connected to the other end of the wiring pattern PT4 (that is, one end of the wiring pattern PT5). The via V4A of the resonator RC3 is connected to the other end of the wiring pattern PT5 (that is, one end of the wiring pattern PT6). The via V2B of the resonator RC2 is connected to the other end of the wiring pattern PT6 (that is, one end of the wiring pattern PT7). The via V2A of the resonator RC2 is connected to the other end of the wiring pattern PT7 (that is, the second end portion E2 of the common electrode PC). As illustrated in FIG. 5, on the common electrode PC, the vias are arranged to have line symmetry with respect to a virtual line CL1 in order to ensure symmetrical or substantially symmetrical filter characteristics.

As described above, the via V1B of the resonator RC1 (second via) is located between the via V1A of the resonator RC1 and the via V3A of the resonator RC3 (first vias) along the common electrode PC. Further, the via V2B of the resonator RC2 (second via) is disposed between the via V2A of the resonator RC2 and the via V4A of the resonator RC4 (first vias) along the common electrode PC. Furthermore, the via V3B of the resonator RC3 and the via V3B of the resonator RC4 (second vias) are disposed between the via V3A of the resonator RC3 and the via V4A of the resonator RC4 (first vias) along the common electrode PC.

In other words, in a path along the common electrode PC, the second via is connected between portions to which the first vias of two adjacent resonators are connected. Note that the vias V3B and V4B adjacent to each other may be regarded as one via like a via V34B illustrated with a broken line in FIG. 5, because both of the adjacent vias V3B and V4B are connected to the ground terminal GND through the plate electrode PG1 and PG2 and the vias VG1, VG2, VG3, VG4, and VG5. This makes a configuration in which the first vias and the second vias are alternately arranged from the first end portion E1 toward the second end portion E2 along the common electrode PC.

As described above, the multiple LC parallel resonators are connected to the strip-shaped common electrode, and the "first via" connected to the ground terminal GND through the capacitor and the "second via" connected to the ground terminal GND without through the capacitor are alternately provided along the common electrode. This makes the adjacent resonators be inductively coupled to each other.

Here, as a multistage filter device defined by multiple LC parallel resonators, a configuration is known in which line conductors defining the resonators are disposed apart from each other. For example, in International Publication No. 2019/097774, as in a filter device 200 illustrated in FIG. 6, vias defining inductors of resonators are connected by individual wiring electrodes PD1 to PD4 independent from each other between the resonators.

In general, in order to improve the characteristics of a filter device, it is required to increase the Q factor. In the filter device using the multistage LC parallel resonators as described above, the Q factor is affected by an air core diameter of the inductor of each resonator, that is, an interval between the vias. Specifically, there is a tendency that the larger the air core diameter of the inductor of each resonator is, the higher the Q factor is. With this, in the filter device, the vias are arranged such that the interval between the vias of each resonator becomes as wide as possible.

Whereas, in order to achieve a desired filter characteristic, it may be necessary to adjust the strength of the magnetic coupling between the resonators. The strength of the magnetic coupling between the resonators may be adjusted by the distance (interval) between the resonators. However, in a case of a multistage filter device, the resonators are coupled to each other, and when a distance between specific resonators is changed, the coupling state of other resonators may also change. Thus, the adjustment by the distance between the resonators may pose difficulty in design. With this, although there is a possibility that the Q factor becomes low, a method to adjust the coupling state by changing the interval between vias is used in many cases because of the simplicity in design. However, when the filter device is further reduced in size, the degree of freedom in the arrangement of the vias is further limited, and there arises a possibility that a desired filter characteristic is not achieved.

In the filter device 100 of Preferred Embodiment 1, as described above, the vias defining the inductors of the multiple LC parallel resonators RC1 to RC4 are connected to the common electrode PC, and the "first via" connected to the ground terminal GND through the capacitor and the "second via" connected to the ground terminal GND without through the capacitor are alternately arranged along the common electrode PC. As described above, since the adjacent resonators are connected to each other by the common electrode, two or more second vias are provided for one first via, particularly in the resonators RC3 and RC4 disposed near the center of the main body 110. This makes it possible to reduce the loss. Further, the coupling state between the resonators may be changed by adjusting the shape (line width or line length, for example) of the common electrode. With this, since the vias may be disposed at positions where an optimum Q factor is achievable in each resonator, it becomes possible to adjust the magnetic coupling between the resonators while reducing or preventing a decrease in the Q factor.

Next, an example of adjusting the magnetic coupling by changing the shape of the common electrode in the filter device 100 of Preferred Embodiment 1 will be described with reference to FIGS. 7A and 7B to FIG. 11.

Figure 6:
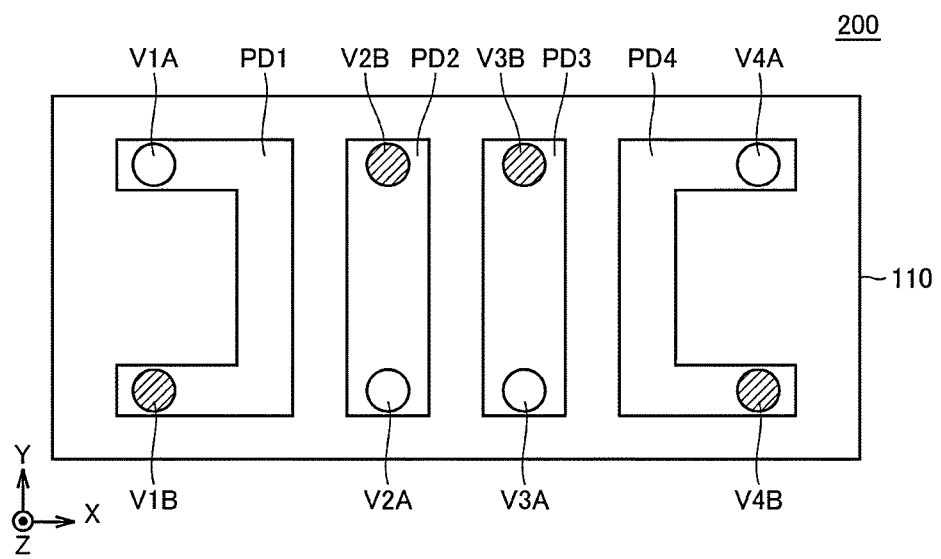
FIG. 6 is a diagram explaining an arrangement of resonators in a filter device of a comparative example.
Figure 7A:
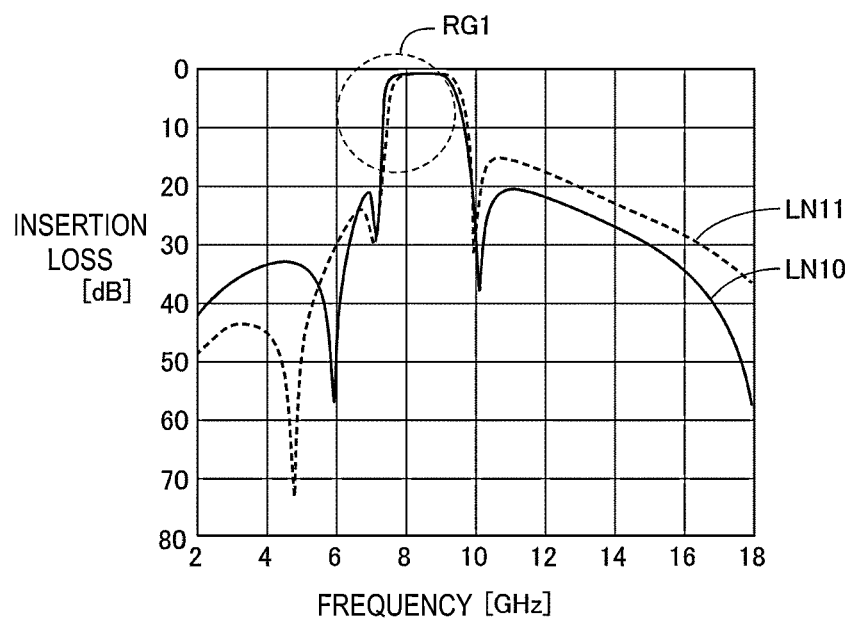
FIGS. 7A and 7B are graphs illustrating a bandpass characteristic of the filter device in FIG. 2.
Figure 7B:
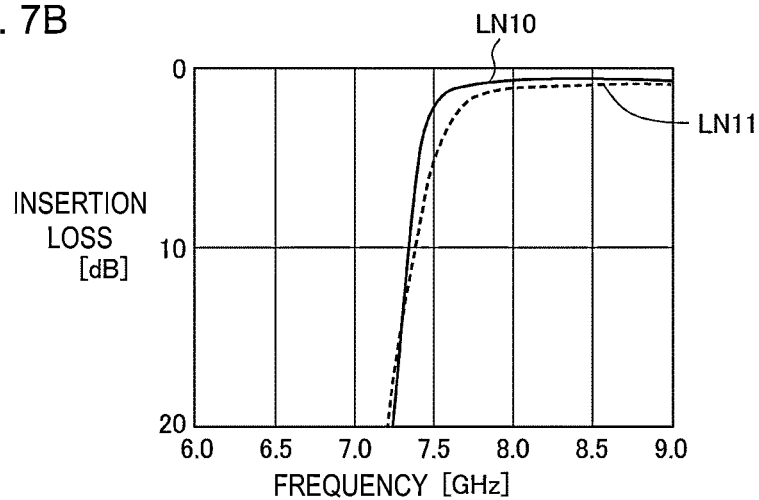

FIGS. 7A and 7B are graphs illustrating the insertion loss (solid line LN10) from the input terminal T1 to the output terminal T2 in the filter device 100 including the common electrode PC with the shape illustrated in FIG. 5, and the insertion loss (broken line LN11) in the filter device 200 of the comparative example illustrated in FIG. 6. Note that FIG. 7B in the lower row is an enlarged view of a portion in a region RG1 in FIG. 7A in the upper row.

Referring to FIGS. 7A and 7B, in the filter device 100 of Preferred Embodiment 1, an attenuation pole in the non-pass band on a lower side relative to the pass band is shifted to the pass band side, as compared with the filter device 200 of the comparative example. With this, as illustrated in FIG. 7B, the pass band is expanded to the lower side, and further, the steepness in the non-pass band is increased. Further, in the filter device 100 of Preferred Embodiment 1, the attenuation at the attenuation pole in the non-pass band on a higher side relative to the pass band is large, as compared with the filter device 200 of the comparative example. As described above, by adopting the configuration in which the resonators are connected to the common electrode PC, the pass band may be expanded and the steepness may be improved.

Figure 8:
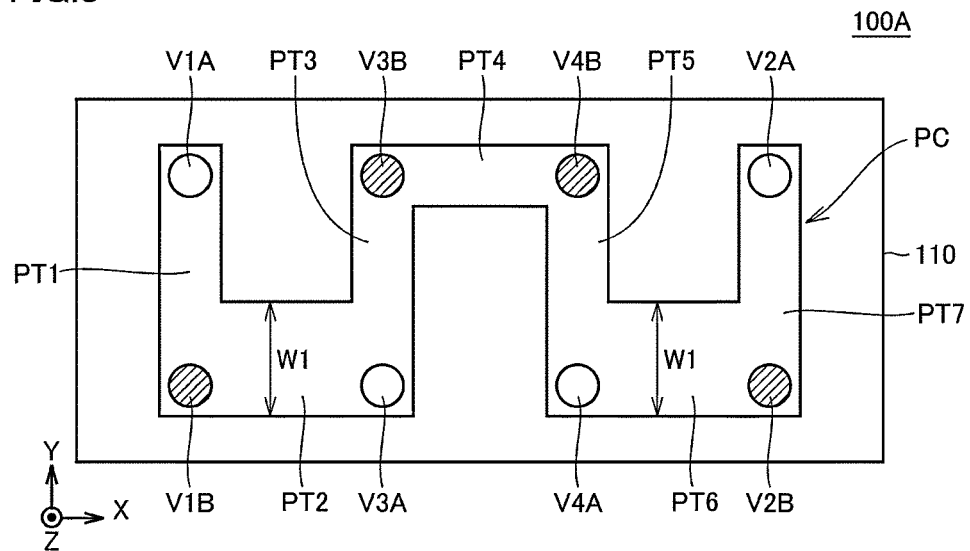
FIG. 8 is a diagram explaining a first example of magnetic coupling adjustment.
Figure 9:
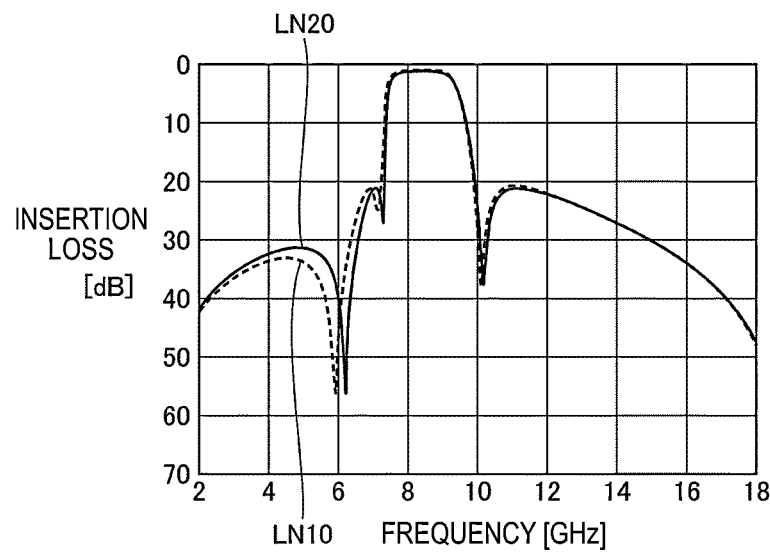
FIG. 9 is a graph illustrating a bandpass characteristic of the first example in FIG. 8.
Figure 10:
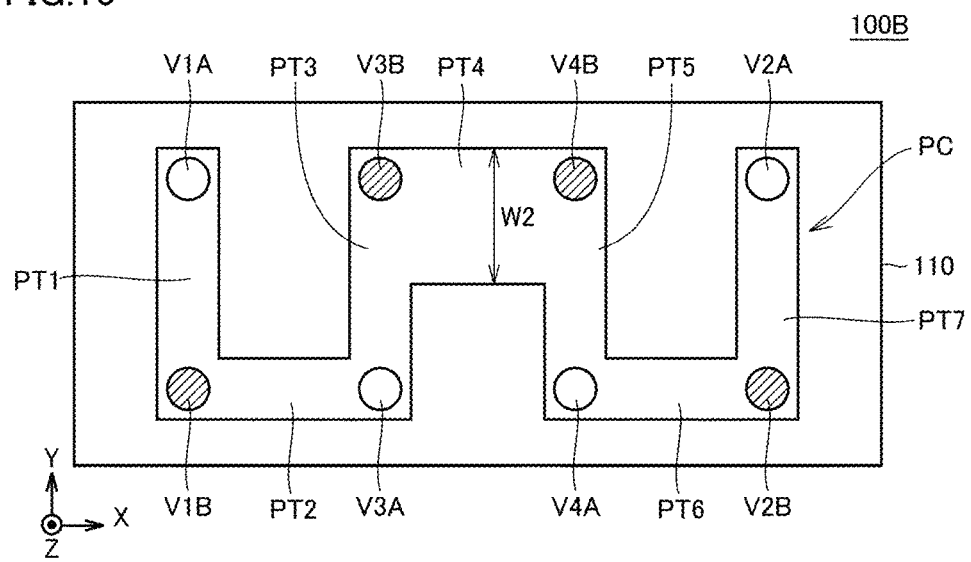
FIG. 10 is a diagram explaining a second example of magnetic coupling adjustment according to an example embodiment of the present invention.
Figure 11:
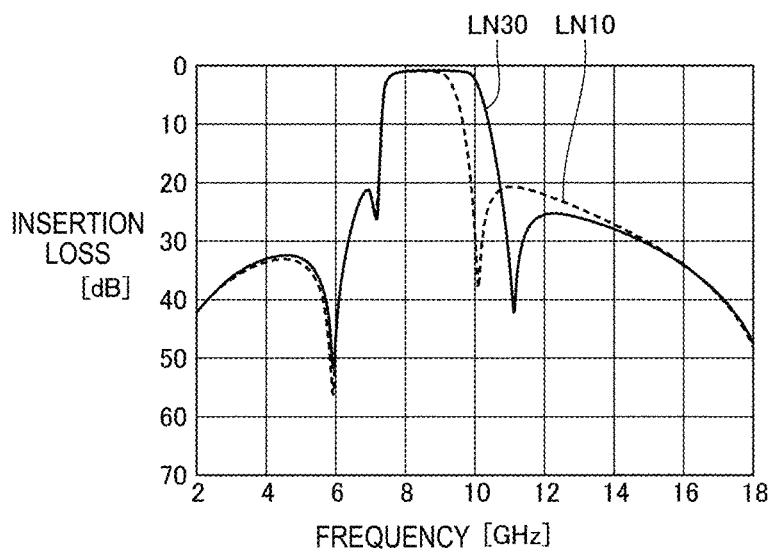
FIG. 11 is a graph illustrating a bandpass characteristic of the second example in FIG. 8.

A filter device 100A and a filter device 100B each including a common electrode PC with a shape different from that of the filter device 100 of Preferred Embodiment 1 were prepared. FIG. 8 is a plan view of the common electrode PC in the filter device 100A. As illustrated in FIG. 8, a line width W1 of the wiring pattern PT2 and the wiring pattern PT6 of the common electrode PC of the filter device 100A is wider than that of the common electrode PC of the filter device 100 illustrated in FIG. 5. That is, in the filter device 100A, the line width of the wiring pattern PT2 and the wiring pattern PT6 of the common electrode PC is wider than the line width of the wiring patterns PT1, PT3, PT4, PT5, and PT7. FIG. 9 is a graph illustrating the insertion loss in the filter device 100A having the common electrode PC with the shape illustrated in FIG. 8. FIG. 10 is a plan view of the common electrode PC in the filter device 100. As illustrated in FIG. 10, in the filter device 100B, a line width W2 of the wiring pattern PT4 of the common electrode PC is wider than that of the common electrode PC of the filter device 100 illustrated in FIG. 5. That is, in the filter device 100B, the line width of the wiring pattern PT4 of the common electrode PC is wider than the line width of the wiring patterns PT1 to PT3, and PT5 to PT7. FIG. 11 is a graph illustrating the insertion loss in the filter device 100B having the common electrode PC with the shape illustrated in FIG. 10. Note that, in FIG. 9 and FIG. 11, the insertion loss in the case of FIG. 5 is illustrated by a broken line LN10 for comparison.

Referring to FIG. 9, when the line width W1 of the wiring patterns PT2 and PT6 is made wider than the line width of the wiring patterns PT1, PT3, PT4, PT5, and PT7 in the common electrode PC, the frequency of the attenuation pole on a lower side relative to the pass band is shifted (solid line LN20 in FIG. 9) to a pass band side as compared with the case of FIG. 5 in which the line widths of the wiring patterns PT1 to PT7 are the same or substantially the same. That is, the steepness of attenuation on the lower side of the pass band is increased. This is because the sensitivity of the magnetic coupling between the resonators RC1 and RC2 becomes higher with a decrease of a shortest distance between the farthest resonators, that is, the resonators RC1 and RC2. The decrease of the shortest distance between the resonators RC1 and RC2 is caused by the increase in the line width of the wiring patterns PT2 and PT6. This means that the inductance values of the inductors L1A and L2A in the equivalent circuit in FIG. 2 decrease, and the ratios of the inductors L1B and L2B in the entire resonator increase.

Next, referring to FIG. 11, when the line width W2 of the wiring pattern PT4 is made wider than the line width of the wiring patterns PT1 to PT3 and PT5 to PT7 in the common electrode PC, a higher side of the pass band is shifted to a higher frequency side, and the pass band width is expanded (solid line LN30 in FIG. 1). This is because the sensitivity of the magnetic coupling between the resonators RC3 and RC4 becomes higher with a decrease of a shortest distance between the resonators RC3 and RC4. The decrease of the shortest distance between the resonators RC3 and RC4 is caused by the increase in the line width of the wiring pattern PT4. This means that the inductance values of the inductors L3A and L4A in the equivalent circuit in FIG. 2 decrease, and the ratios of the inductors L3B and L4B in the entire resonator increase.

As described above, in a filter device defined by multiple LC parallel resonators, the magnetic coupling between the resonators may be adjusted to a coupling state corresponding to a desired filter characteristic, by adopting a configuration in which the resonators are connected by a common electrode and the shape of the common electrode is changed. In the case above, changing the arrangement of vias defining the inductors of the resonators is not needed. This makes it possible to reduce or prevent a decrease in the Q factor.

MODIFICATIONS

In the following modifications of preferred embodiments of the present invention, examples in which the number of stages of LC parallel resonators included in a filter device is different, and in which an arrangement of vias in resonators is different will be described.

Modification 1

Figure 12:
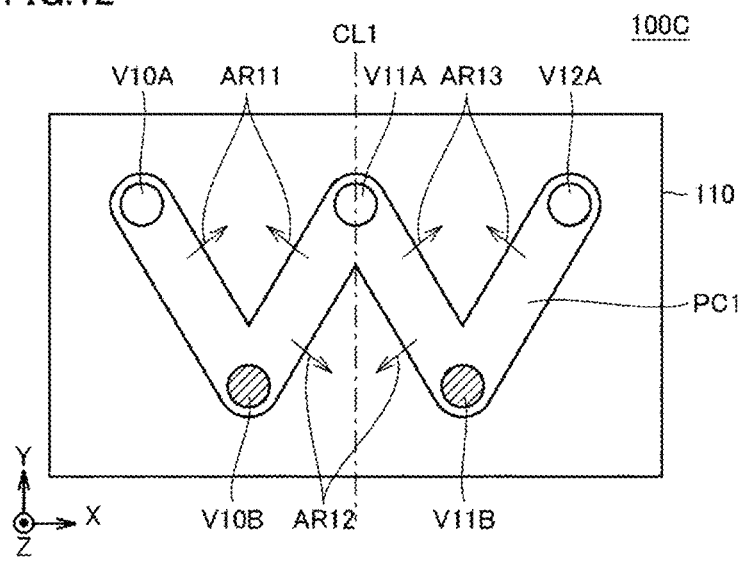
FIG. 12 is a plan view of a common electrode of a filter device of Modification 1 of a preferred embodiment of the present invention.

FIG. 12 is a plan view of a common electrode PC1 in a filter device 100C of Modification 1 of a preferred embodiment of the present invention. The filter device 100C is an example of a configuration including three LC parallel resonators.

Referring to FIG. 12, in the filter device 100C, first vias V10A, V11A, and V12A of the resonators are provided along one long side of the main body 110 in parallel with the X-axis, and second vias V10B and V11B are provided along the other long side. The common electrode PC1 is provided in a substantially W-shape to extend from the via V10A to via V12A connecting the via V10B, via V11A, and via V11B. That is, the first vias and the second vias are alternately arranged in a zigzag shape along a path from the first end portion to the second end portion of the common electrode PC1.

In the filter device 100C, the second via of the resonator including the via V11A is merged into the via V10B and/or the via V11B in order to arrange the vias to have line symmetry with respect to the virtual line CL1.

In the configuration above, the magnetic coupling between the first stage and second stage resonators and the magnetic coupling between the first stage and third stage resonators may be adjusted, by adjusting the line widths of the wiring pattern connecting the vias V10A and V10B and the wiring pattern connecting the vias V10B and V11A in a direction of an arrow AR11.

Further, the magnetic coupling between the second stage and third stage resonators may be adjusted, by adjusting the line widths of the wiring pattern connecting the vias V10B and V11A and the wiring pattern connecting the vias V11A and V11B in a direction of an arrow AR12.

Furthermore, the magnetic coupling between the second stage and third stage resonators and the magnetic coupling between the first stage and third stage resonators may be adjusted, by adjusting the line widths of the wiring pattern connecting the vias V11A and V11B and the wiring pattern connecting the vias V11B and V12A in a direction of an arrow AR13.

As described above, even in a case that a filter device includes three LC parallel resonators, the coupling state between the resonators may be adjusted without changing via positions, by connecting the resonators to a common electrode and changing a line width or the like of the common electrode. Accordingly, it becomes possible to adjust the coupling between resonators while reducing or preventing a decrease in the Q factor.

Modification 2

Figure 13:
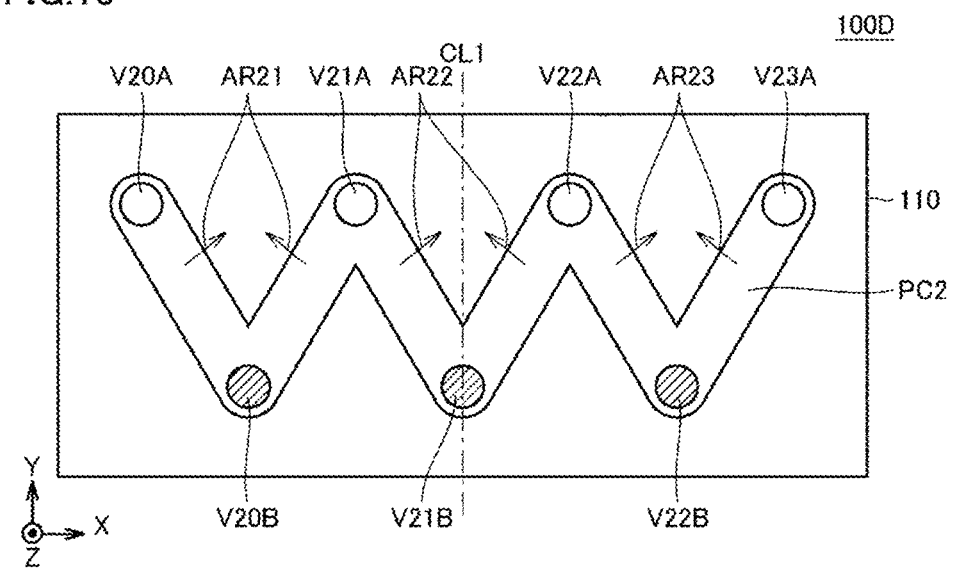
FIG. 13 is a plan view of a common electrode of a filter device of Modification 2 of a preferred embodiment of the present invention.

FIG. 13 is a plan view of a common electrode PC2 in a filter device 100D of Modification 2 of a preferred embodiment of the present invention. The filter device 100D includes four LC parallel resonators as in Preferred Embodiment 1, but is different in the arrangement of vias as compared with the filter device 100.

Referring to FIG. 13, in the filter device 100D, first vias V20A to V23A are provided along one long side of the main body 110, and second vias V20B to V22B are provided along the other long side as in Modification 1. The common electrode PC2 is provided to extend from the via V20A to via V23A connecting the via V20B, via V21A, via V21B, via V22A, and via V22B. That is, the first vias and the second vias are alternately arranged in a zigzag shape along a path from the first end portion toward the second end portion of the common electrode PC2.

In the filter device 100D, the second via of any of the resonators is merged into the second via of the adjacent resonator in order to arrange the vias to have line symmetry with respect to the virtual line CL1.

In the configuration above, the magnetic coupling between the first stage and second stage resonators, the magnetic coupling between the first stage and third stage resonators, and the magnetic coupling between the first stage and fourth stage resonators may be adjusted, by adjusting the line widths of the wiring pattern connecting the vias V20A and V20B and the wiring pattern connecting the vias V20B and V21A in a direction of an arrow AR21.

Further, the magnetic coupling between the second stage and third stage resonators may be adjusted, by adjusting the line widths of the wiring pattern connecting the vias V21A and V21B and the wiring pattern connecting the vias V21B and V22A in a direction of an arrow AR22.

Furthermore, the magnetic coupling between the first stage and fourth stage resonators, the magnetic coupling between the second stage and fourth stage resonators, and the magnetic coupling between the third stage and fourth stage resonators may be adjusted, by adjusting the line widths of the wiring pattern connecting the vias V22A and V22B and the wiring pattern connecting the vias V22B and V23A in a direction of an arrow AR23.

As described above, even in a case that the arrangement of vias in a filter device is different, the coupling state between resonators may be adjusted without changing via positions, by connecting the resonators to a common electrode and changing a line width or the like of the common electrode. Accordingly, it becomes possible to adjust the coupling between resonators while reducing or preventing a decrease in the Q factor.

Modification 3

Figure 14:
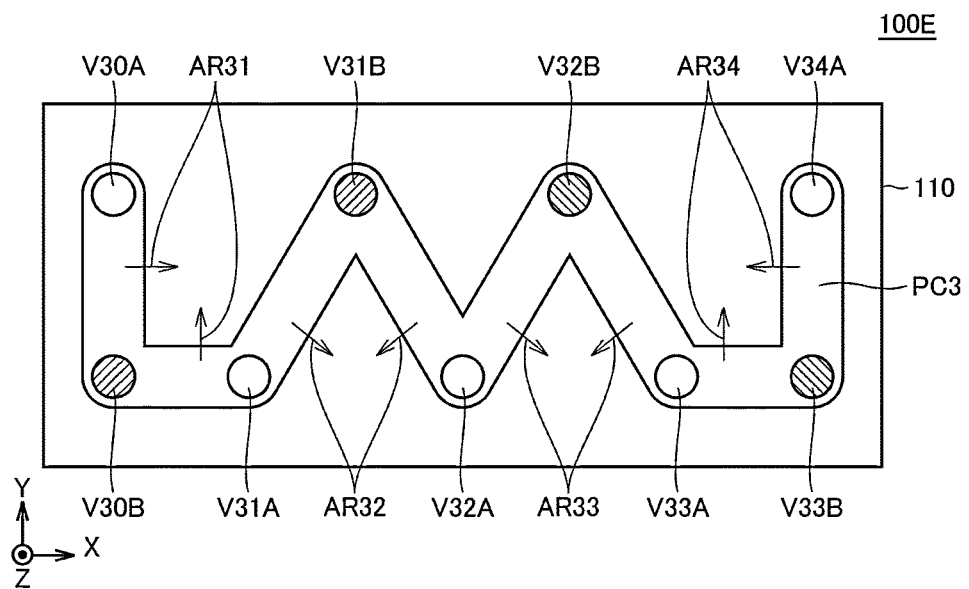
FIG. 14 is a plan view of a common electrode of a filter device of Modification 3 of a preferred embodiment of the present invention.

FIG. 14 is a plan view of a common electrode PC3 in a filter device 100E of Modification 3 of a preferred embodiment of the present invention. The filter device 100E is an example of a configuration including five LC parallel resonators.

Referring to FIG. 14, in the filter device 100E, a first via V30A, a second via V31B, a second via V32B, and a first via V34A are arranged along one long side of the main body 110, and a second via V30B, first vias V31A to V33A, and a second via V33B are arranged along the other long side. The common electrode PC3 is provided to extend from the via V30A to the via V34A connecting the via V30B, via V31A, via V31B, via V32A, via V32B, via V33A, and via V33B.

In the filter device 100E, the second via of any of the resonators is merged into the second via of the adjacent resonator in order to arrange the vias to have line symmetry with respect to the virtual line CL1. Note that, also in a five-stage filter device, the vias may be arranged in a zigzag shape as in Modification 1 and Modification 2.

In the configuration above, the magnetic coupling between the first stage and second stage resonators, the magnetic coupling between the first stage and third stage resonators, the magnetic coupling between the first stage and fourth stage resonators, and the magnetic coupling between the first stage and fifth stage resonators may be adjusted, by adjusting the line widths of the wiring pattern connecting the vias V30A and V30B and the wiring pattern connecting the vias V30B and V31A in a direction of an arrow AR31.

Further, the magnetic coupling between the second stage and third stage resonators and the magnetic coupling between the second stage and fourth stage resonators may be adjusted, by adjusting the line widths of the wiring pattern connecting the vias V31A and V31B and the wiring pattern connecting the vias V31B and V32A in a direction of an arrow AR32.

Further, the magnetic coupling between the second stage and fourth stage resonators and the magnetic coupling between the third stage and fourth stage resonators may be adjusted, by adjusting the line widths of the wiring pattern connecting the vias V32A and V32B and the wiring pattern connecting the vias V32B and V323 in a direction of an arrow AR33.

Furthermore, the magnetic coupling between the first stage and fifth stage resonators, the magnetic coupling between the second stage and fifth stage resonators, the magnetic coupling between the third stage and fifth stage resonators, and the magnetic coupling between the fourth stage and fifth stage resonators may be adjusted, by adjusting the line widths of the wiring pattern connecting the vias V33A and V33B and the wiring pattern connecting the vias V33B and V34A in a direction of an arrow AR34.

As described above, even in a case that a filter device includes five LC parallel resonators, the coupling state between the resonators may be adjusted without changing via positions, by connecting the resonators to a common electrode and changing a line width or the like of the common electrode. Accordingly, it becomes possible to adjust the coupling between resonators while reducing or preventing a decrease in the Q factor.

Modification 4

Figure 15:
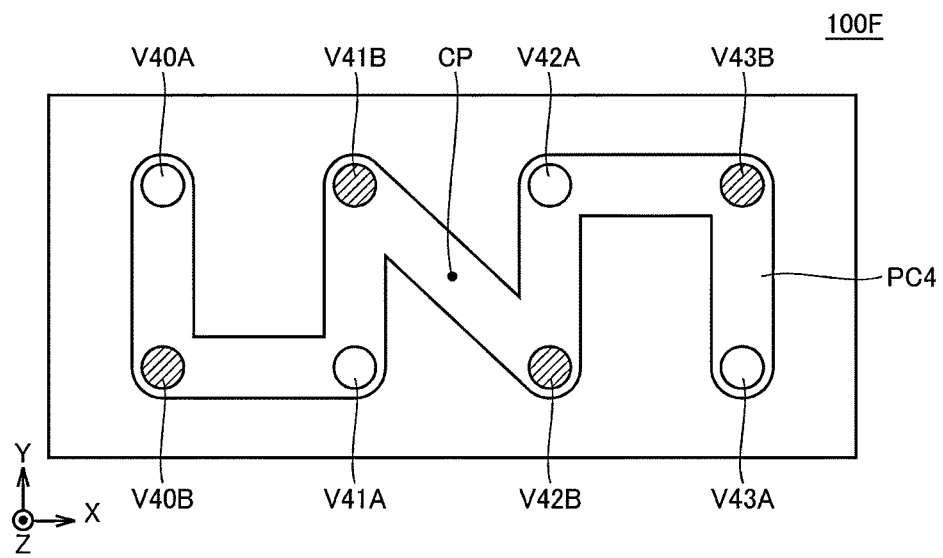
FIG. 15 is a plan view of a common electrode of a filter device of Modification 4 of a preferred embodiment of the present invention.

FIG. 15 is a plan view of a common electrode PC4 of a filter device 100F of Modification 4 of a preferred embodiment of the present invention. The filter device 100F preferably includes four LC parallel resonators as in Preferred Embodiment 1 and Modification 2, but the arrangement of vias is further different. More specifically, in the filter device 100F, the vias are arranged to have rotational symmetry.

Referring to FIG. 15, in the filter device 100F, a first via V40A, a second via V41B, a first via V42A, and a second via V43B are arranged along one long side of the main body 110, and a second via V40B, a first via V41A, a second via V42B, and a first via V43A are arranged along the other long side. The common electrode PC4 is provided to extend from the via V40A to the via V43A connecting the via V40B, via V41A, via V41B, via V42B, via V42A, and via V43B. In the common electrode PC4, the vias are arranged to have rotational symmetry with respect to a point CP.

As described above, even in a case that vias are arranged to have rotational symmetry in a filter device, the coupling state between resonators may be adjusted without changing via positions, by connecting the resonators to a common electrode and changing a line width or the like of the common electrode. Accordingly, it becomes possible to adjust the coupling between resonators while reducing or preventing a decrease in the Q factor.

The features of preferred embodiments of the present invention are also applicable to a filter device having six or more stages.

Preferred Embodiment 2

In FIG. 8 and FIG. 10 of Preferred Embodiment 1, there has been described a method of adjusting magnetic coupling by adjusting a line width of a wiring pattern connecting resonators.

In Preferred Embodiment 2 of the present invention, another adjustment example of magnetic coupling of the resonator RC1 and the resonator RC2 connected to the input and output terminals will be described.

Figure 16:
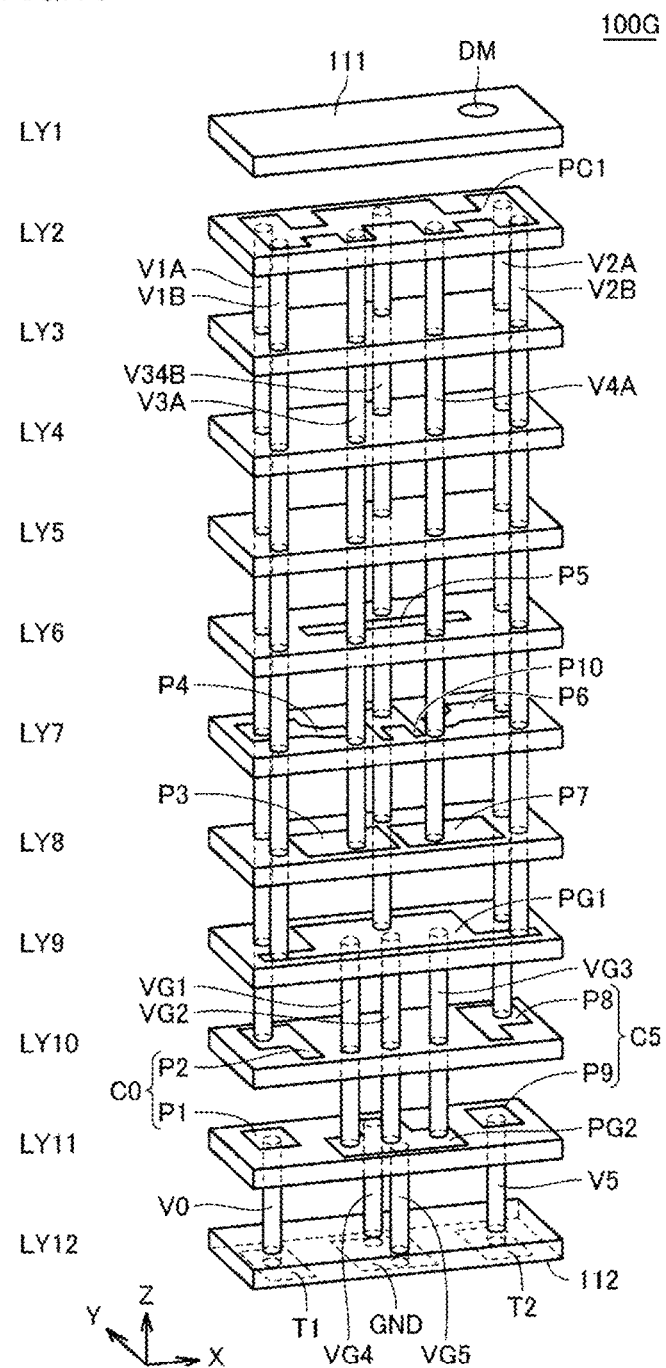
FIG. 16 is an exploded perspective view of a filter device of Preferred Embodiment 2 of the present invention illustrating an example of a multilayer structure thereof.

FIG. 16 is an exploded perspective view of a filter device 100G of Preferred Embodiment 2 illustrating an example of a multilayer structure thereof. Further, FIG. 17 is a plan view of a common electrode PC1 in the filter device 100G of FIG. 16.

Referring to FIG. 16, the filter device 100G has a configuration described as follows. The common electrode PC in the filter device 100 of Preferred Embodiment 1 described in FIG. 4 is replaced with the common electrode PC1, the vias V3B and V4B are replaced with one via V34B as described in FIG. 5, and further, a plate electrode P10 provided on the seventh layer LY7 is added. In the filter device 100G, a description of the same or corresponding elements as those in FIG. 4 will not be repeated.

The plate electrode P10 is preferably, for example, U-shaped or substantially U-shaped, and is located between the plate electrode P4 and the plate electrode P6 of the seventh layer LY7. The plate electrode P10 is connected to the via V34B, and is connected to the common electrode PC1 and the plate electrode PG1 (that is, ground terminal GND) through the via V34B. The plate electrode P10 is capacitively coupled to the plate electrode P5 provided on the sixth layer LY6 and the capacitor electrodes P3 and P7 provided on the eighth layer LY8. The plate electrode P10 increases the capacitance of the capacitors C1 to C4 (FIG. 2) in the resonators RC1 to RC4.

Figure 17:
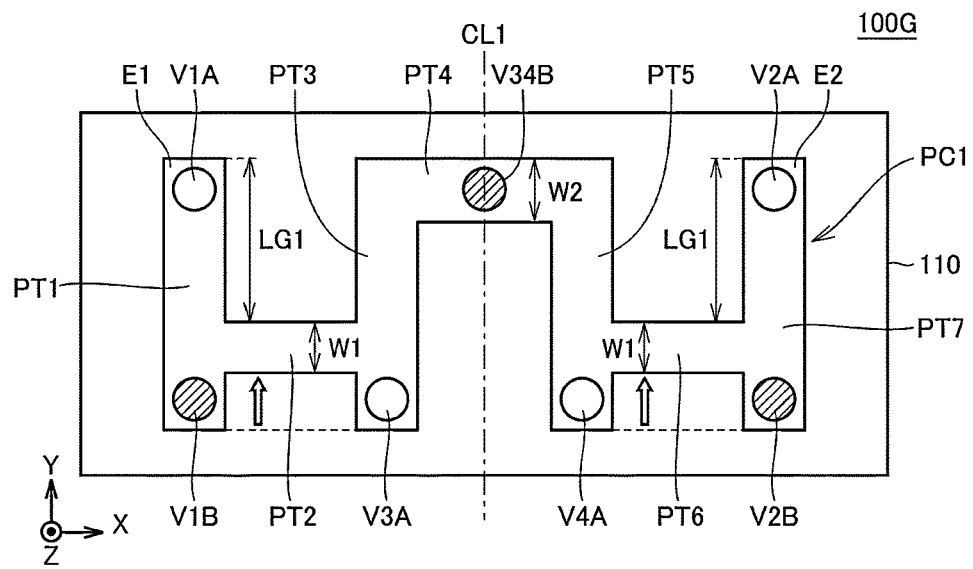
FIG. 17 is a plan view of a common electrode of the filter device in FIG. 16.

Further, in the common electrode PC1 provided on the second layer LY2, as illustrated in FIG. 17, connection positions of the wiring pattern PT2 with the wiring patterns PT1 and PT3 and connection positions of the wiring pattern PT6 with the wiring patterns PT5 and PT7 are shifted to the positive direction in the Y-axis. In other words, the wiring pattern PT2 is connected to a first portion and a second portion below. The first portion is a portion of the wiring pattern PT1 located between a portion to which the via V1A (first via) of the resonator RC1 is connected and a portion to which the via V1B (second via) is connected. The second portion is a portion of the wiring pattern PT3 located between a portion to which the via V3A (first via) of the resonator RC3 is connected and a portion to which the via V34B (second via) is connected. Further, the wiring pattern PT6 is connected to a third portion and a fourth portion below. The third portion is a portion of the wiring pattern PT7 located between a portion to which the via V2A (first via) of the resonator RC2 is connected and a portion to which the via V2B (second via) is connected. The fourth portion is a portion of the wiring pattern PT5 located between a portion to which the via V4A (first via) of the resonator RC4 is connected and a portion to which the via V34B (second via) is connected.

With the wiring pattern PT2, which connects the resonator RC1 and the resonator RC3, approaching to an open end side of the resonator RC1 (that is, side of via V1A), the shortest distance of a path from the via V1A to the via V34B is shortened. This makes it possible to strengthen the magnetic coupling between the resonator RC1 and the resonator RC3. Similarly, with the wiring pattern PT6, which connects the resonator RC2 and the resonator RC4, approaching to an open end side of the resonator RC4 (that is, side of via V2A), the shortest distance of a path from the via V2A to the via V34B is shortened. This makes it possible to strengthen the magnetic coupling between the resonator RC2 and the resonator RC4. That is, the magnetic coupling between the resonators RC1 and RC2 and other resonators may be adjusted, by adjusting a distance LG1 from an end portion of the wiring pattern PT1 on the side of the via V1A to the wiring pattern PT2, and the distance LG1 from an end portion of the wiring pattern PT7 on the side of the via V2A to the wiring pattern PT6.

As described with reference to FIG. 8, the inductance values of the wiring patterns PT2 and PT6 may be adjusted by adjusting the line width W1 of the wiring patterns PT2 and PT6. Further, as described with reference to FIG. 10, the inductance value of the wiring pattern PT4 may be adjusted by adjusting the line width W2 of the wiring pattern PT4 between the resonators RC3 and RC4.

As illustrated in FIG. 8, when the line width W1 of the wiring patterns PT2 and PT6 are adjusted in a state that sides of the wiring patterns PT2 and PT6 on the negative direction side of the Y-axis are fixed to the end portions of the wiring patterns PT1 and PT7 on the negative direction side of the Y-axis, increasing the inductance value by narrowing the line width W1 makes the distance LG1 be lengthened, so that the magnetic coupling between the resonators is weakened. To the contrary, decreasing the inductance values by widening the line width W1 makes the distance LG1 be shortened, so that the magnetic coupling between the resonators is strengthened. That is, the magnitude of the inductance value of the inductor connecting the resonators and the magnetic coupling between the resonators change in conjunction with each other. With this, for example, when it is desired to increase an inductance value between resonators and further strengthen the magnetic coupling between the resonators as in a small-sized filter device, there may arise a case that a desired filter characteristic is not achieved by the adjustment method described above.

In the configuration of Preferred Embodiment 2, the inductance value between the resonators is adjusted by the line width W1 of the wiring patterns PT2 and PT6, and the magnetic coupling between the resonators may be adjusted by adjusting the connection positions of the wiring patterns PT2 and PT6 (that is, distance LG1). Thus, the inductance value between the resonators and the magnetic coupling between the resonators may independently be adjusted. With this, the degree of freedom in design increases, and a desired filter characteristic may easily be achieved.

Increasing an inductance value between resonators has an advantageous effect of increasing the impedance of the resonators. Increasing the magnetic coupling between the resonator RC1 and the resonator RC4 has an advantageous effect of shifting the attenuation pole in the vicinity of the pass band to a pass band side. Further, increasing the magnetic coupling between the resonator RC2 and the resonator RC3 may expand the pass band width.

In the example above, the case that the line widths and the connection positions are adjusted for both of the wiring patterns PT2 and PT6 has been described, but the line width and the connection position may be adjusted for only one of the wiring patterns PT2 and PT6.

Figure 18:
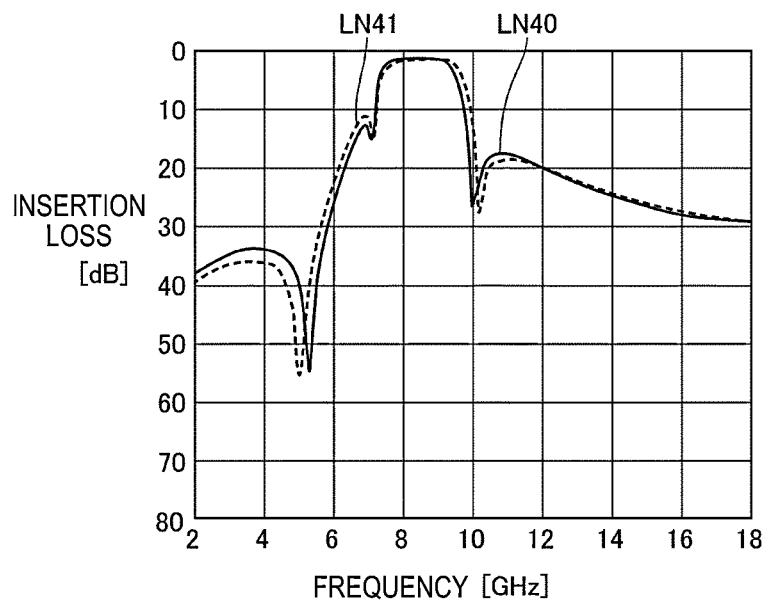
FIG. 18 is a graph illustrating a bandpass characteristic of the filter device in FIG. 16.

FIG. 18 is a graph comparing the insertion loss when the connection positions (that is, distance LG1) of the wiring patterns PT2 and PT6 are changed in a state that the wiring patterns PT2 and PT6 have the same or substantially the same line width W1 in the filter device 100G of Preferred Embodiment 2 and the filter device 100 of Preferred Embodiment 1. Note that the connection positions of the wiring patterns PT2 and PT6 in the filter device 100G are closer to the vias V1A and V2A than the connection positions of the wiring patterns PT2 and PT6 in the filter device 100. In FIG. 18, a solid line LN40 illustrates the case of the filter device 100G, and a broken line LN41 illustrates the case of the filter device 100.

As illustrated in FIG. 18, frequencies at which attenuation poles are generated are closer to the pass band side in the filter device 100G than in the filter device 100 since the magnetic coupling between the resonators is strengthened. That is, the steepness of attenuation in the non-pass band may be increased.

Although not illustrated in FIG. 18, the line width W2 and the connection position may individually be adjusted also for the wiring pattern PT4 connecting the resonator RC3 and the resonator RC4.

As described above, individually performing the adjustment of the inductance value by the line width of the wiring pattern connecting the resonators and the adjustment of the magnetic coupling between the resonators by the connection position of the wiring pattern increases the degree of freedom in design, and this makes it possible to achieve a desired filter characteristic.

Note that the "wiring pattern PT2" and the "wiring pattern PT6" in Preferred Embodiment 2 respectively correspond to a "first portion" and a "second portion".

Preferred Embodiment 3

In Preferred Embodiment 3 of the present invention, a configuration of a filter device will be described in which an attenuation characteristic in the vicinity of a pass band is further improved.

Figure 19:
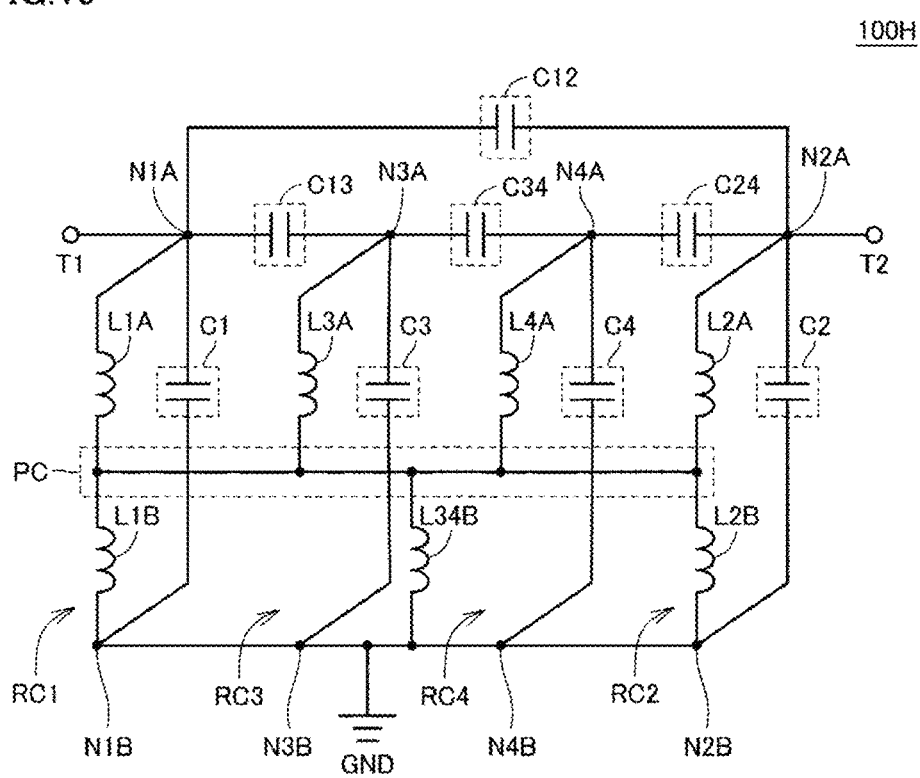
FIG. 19 is an equivalent circuit diagram of a filter device of Preferred Embodiment 3 of the present invention.

FIG. 19 is an equivalent circuit diagram of a filter device 100H of Preferred Embodiment 3. The filter device 100H has a configuration in which the capacitors C0 and C5, provided at the input and output terminals in the equivalent circuit of the filter device 100 illustrated in FIG. 2, are removed, the inductors L3B and L4B in the resonators RC3 and RC4 are merged into an inductor L34B, and the resonators RC3 and RC4 are coupled to each other by a capacitor C34. In FIG. 19, a description of the same or corresponding elements as those in FIG. 2 will not be repeated.

Figure 20:
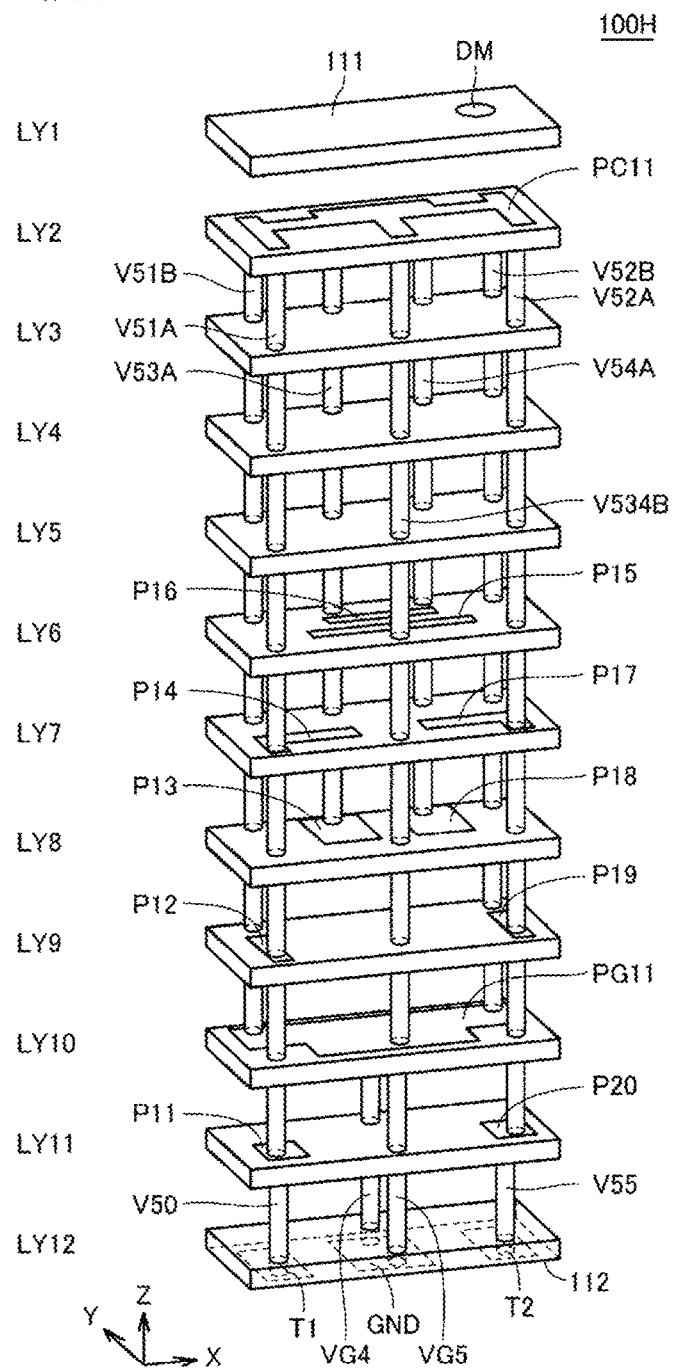
FIG. 20 is an exploded perspective view of the filter device in FIG. 19 illustrating a multilayer structure thereof.

FIG. 20 is an exploded perspective view of the filter device 100H of Preferred Embodiment 3 illustrating an example of a multilayer structure thereof. Referring to FIG. 20, in the filter device 100H, as in the filter device 100, the resonators RC1 to RC4 are provided in the main body 110 including the multiple dielectric layers LY1 to LY12. The resonator RC1 includes vias V51A and V51B, and a capacitor electrode P12. The resonator RC2 includes vias V52A and V52B, and a capacitor electrode P19. The resonator RC3 includes vias V53A and V534B, and a capacitor electrode P13. The resonator RC4 includes vias V54A and V534B, and a capacitor electrode P18.

The direction mark DM for specifying the direction of the filter device 100 is disposed on the upper surface 111 (first layer LY1) of the main body 110. Further, external terminals (input terminal T1, output terminal T2, and ground terminal GND) for connecting to an external device are disposed on the lower surface 112 (twelfth layer LY12) of the main body 110.

The input terminal T1 is connected to a plate electrode P11 of the eleventh layer LY11 by a via V50. The via V51A of the resonator RC1 is connected to the plate electrode P11. The via V51A is connected to a common electrode PC11 provided on the second layer LY2. Further, the common electrode PC11 is connected to a plate electrode PG11 provided on the tenth layer LY10 by the via V51B. The plate electrode PG11 is connected to the ground terminal GND provided on the twelfth layer LY12 by the vias VG4 and VG5.

The via V51A is connected to the capacitor electrode P12 of the ninth layer LY9, and is further connected to a capacitor electrode P14 of the seventh layer LY7. A portion of the capacitor electrode P12 opposes the plate electrode PG11 of the tenth layer LY10. The capacitor electrode P12 and the plate electrode PG11 define the capacitor C1 in FIG. 19. Note that the via V51A and the via V51B respectively correspond to the inductor L1A and the inductor L1B in FIG. 19.

The output terminal T2 is connected to a plate electrode P20 of the eleventh layer LY11 by a via V55. The via V52A of the resonator RC2 is connected to the plate electrode P20. The via V52A is connected to the common electrode PC11 of the second layer LY2. Further, the common electrode PC11 is connected to the plate electrode PG11 provided on the tenth layer LY10 by the via V52B.

The via V52A is connected to the capacitor electrode P19 of the ninth layer LY9, and is further connected to a capacitor electrode P17 of the seventh layer LY7. A portion of the capacitor electrode P19 opposes the plate electrode PG11 of the tenth layer LY10. The capacitor electrode P19 and the plate electrode PG11 define the capacitor C2 in FIG. 19. Note that the via V52A and the via V52B respectively correspond to the inductor L2A and the inductor L2B in FIG. 19.

The capacitor electrode P14 provided on the seventh layer LY7 opposes the capacitor electrode P13 of the resonator RC3 provided on the eighth layer LY8. The capacitor electrode P13 and the capacitor electrode P14 define the capacitor C13 in FIG. 19.

The capacitor electrode P13 is connected to the common electrode PC11 of the second layer LY2 by the via V53A. Further, the common electrode PC11 is connected to the plate electrode PG11 of the tenth layer LY10 by the via V534B. The capacitor electrode P13 opposes the plate electrode PG11, and the capacitor electrode P13 and the plate electrode PG11 define the capacitor C3 in FIG. 19.

The via V53A corresponds to the inductor L3A in FIG. 19. Further, the via V534B corresponds to the inductor L34B in FIG. 19.

The capacitor electrode P17 of the seventh layer LY7 opposes the capacitor electrode P18 of the resonator RC4 provided in the eighth layer LY8. The capacitor electrode P17 and the capacitor electrode P18 define the capacitor C24 in FIG. 19.

The capacitor electrode P18 is connected to the common electrode PC11 of the second layer LY2 by the via V54A. Further, the common electrode PC11 is connected to the plate electrode PG11 of the tenth layer LY10 by the via V534B as described above. The capacitor electrode P18 opposes the plate electrode PG11, and the capacitor electrode P18 and the plate electrode PG11 define the capacitor C4 in FIG. 19. The via V54A corresponds to the inductor L4A in FIG. 19.

A portion of the capacitor electrode P14 and a portion of the capacitor electrode P17 of the seventh layer LY7 oppose a capacitor electrode P15 provided on the sixth layer LY6. The capacitor electrodes P14, P15 and P17 define the capacitor C12 in FIG. 19.

Further, a capacitor electrode P16 is further provided on the sixth layer LY6. The capacitor electrode P16 partially opposes the capacitor electrodes P13 and P18 of the eighth layer LY8. The capacitor electrodes P13, P16 and P18 define the capacitor C34 in FIG. 19.

In Preferred Embodiment 3, the vias V51A, V52A, V53A, and V54A, each connected to the ground terminal GND through the capacitor in each resonator, are referred to as a "first via". Further, the vias V51B, V52B, and V534B, each connected to the ground terminal GND without through the capacitor in each resonator, are referred to as a "second via".

Figure 21:
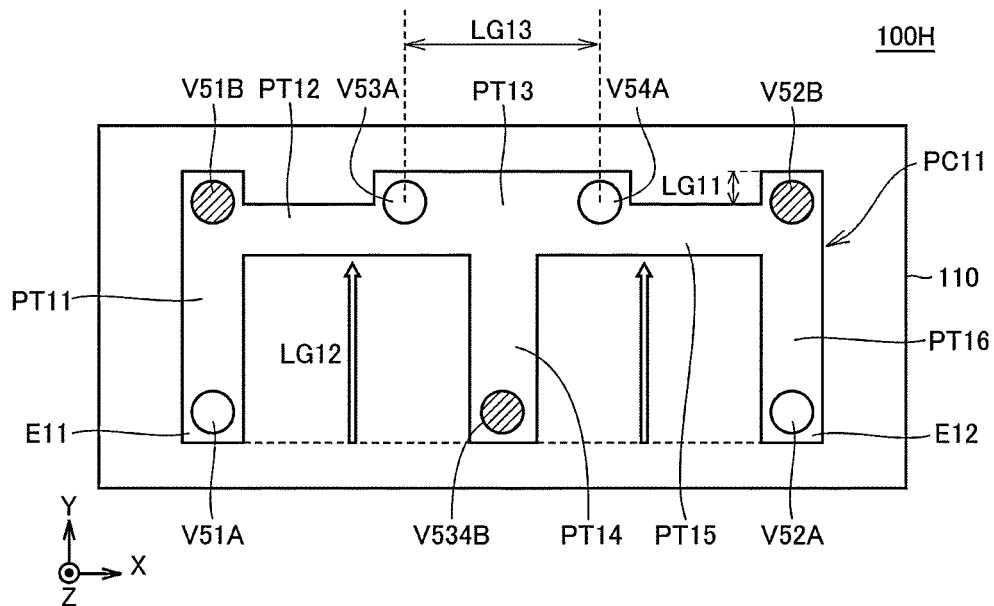
FIG. 21 is a plan view of a common electrode of the filter device in FIG. 19.

FIG. 21 is a plan view of the common electrode PC11 in the filter device 100H. The common electrode PC11 is defined by a strip-shaped wiring pattern including a first end portion E11 and a second end portion E12. As illustrated in FIG. 21, the common electrode PC11 includes wiring patterns PT11, PT14, and PT16 extending along the short side (Y-axis) of the main body 110 and wiring patterns PT12, PT13, and PT15 extending along the long side (X-axis) of the main body 110. The wiring patterns PT12, PT13, and PT15 are connected in series between the wiring pattern PT11 and the wiring pattern PT16. The wiring pattern PT14 is connected to the wiring pattern PT13. That is, the common electrode PC11 have an E-shape or a substantially E-shape, for example.

The first end portion E11 of the common electrode PC11 (that is, one end of the wiring pattern PT11) is connected to the via V51A of the resonator RC1. The via V51B of the resonator RC1 is connected to the other end of the wiring pattern PT11. The via V52A of the resonator RC2 is connected to the second end portion E12 of the common electrode PC11 (that is, one end of the wiring pattern PT16). The via V52B of the resonator RC2 is connected to the other end of the wiring pattern PT12.

The via V53A of the resonator RC3 is connected to an end portion of the wiring pattern PT13 on a side of the wiring pattern PT11. Further, the via V54A of the resonator RC4 is connected to an end portion of the wiring pattern PT13 on a side of the wiring pattern PT16.

The wiring pattern PT12 is connected between the wiring pattern PT11 and the wiring pattern PT13. The wiring pattern PT15 is connected between the wiring pattern PT11 and the wiring pattern PT16.

The via V534B shared by the resonators RC3 and RC4 is connected to one end of the wiring pattern PT14. The other end of the wiring pattern PT14 is connected to the wiring pattern PT13.

In other words, in the common electrode PC11, from the first end portion E11 toward the second end portion E12, the via V51A, via V51B, via V53A, via V54A, via V52B, and via V52A are connected to the common electrode PC11 in this order along the common electrode PC11.

The common electrode PC11 is E-shaped or substantially E-shaped, for example, and a portion to which the via V53A of the resonator RC3 is connected and a portion to which the V via 54A of the resonator RC4 is connected are adjacent to each other. This makes the shortest distance along the common electrode PC11 between the via V51A of the resonator RC1 and the via V54A of the resonator RC4 be shorter than that in the common electrode PC of Preferred Embodiment 1 having a meandering or serpentine shape illustrated in FIG. 5. That is, the magnetic coupling between the resonator RC1 and the resonator RC4 is stronger than that in the filter device 100 of Preferred Embodiment 1.

Similarly, the shortest distance along the common electrode PC11 between the via V52A of the resonator RC2 and the via V53A of the resonator RC3, and the shortest distance along the common electrode PC11 between the via V51A of the resonator RC1 and the via V52A of the resonator RC2 are also shortened. With this, the magnetic coupling between the resonator RC2 and the resonator RC3 and the magnetic coupling between the resonator RC1 and the resonator RC2 are strengthened.

It is known that, in a filter device having four stage resonators, when the magnetic coupling between a first stage resonator and a third stage resonator and the magnetic coupling between a second stage resonator and a fourth stage resonator are strengthened, attenuation on a higher frequency side relative to a pass band increases, in general. Further, it is known that, when the magnetic coupling between a first stage resonator and a fourth stage resonator is strengthened, attenuation on a lower frequency side relative to a pass band increases. With this, by forming the common electrode PC11 in the shape illustrated in FIG. 21, the attenuation characteristic in the vicinity of the pass band may be improved.

Figure 22:
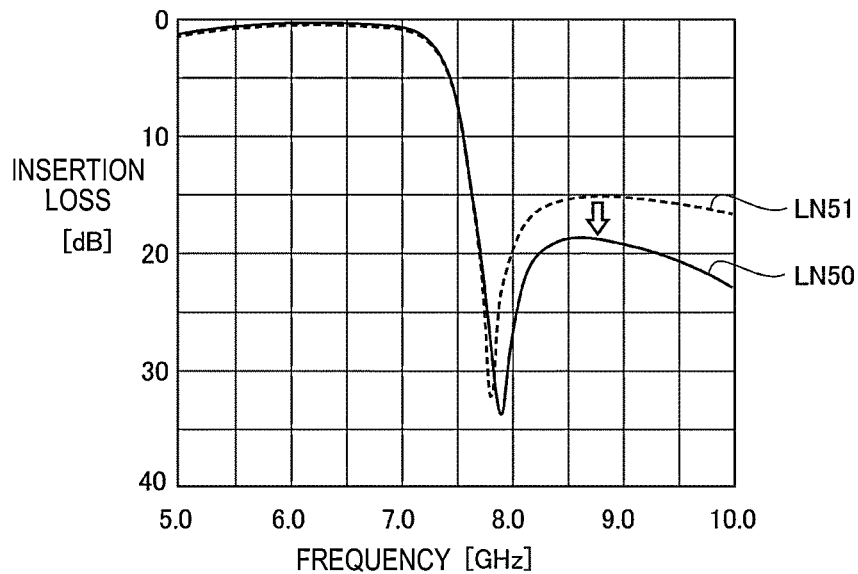
FIG. 22 is a graph illustrating a bandpass characteristic of the filter device in FIG. 19.

FIG. 22 is a graph explaining the bandpass characteristic of the filter device 100H in FIG. 19. In FIG. 22, the horizontal axis represents frequency, and the vertical axis represents insertion loss. Note that, in FIG. 22, a portion on the higher frequency side relative to the pass band is illustrated. A solid line LN50 in FIG. 22 illustrates the case of the filter device 100H of Preferred Embodiment 3, and a broken line LN51 illustrates the case of the filter device 100 of Preferred Embodiment 1.

As illustrated in FIG. 22, the insertion loss (attenuation) on the higher frequency side relative to the attenuation pole is larger in the filter device 100H (solid line LN50) than in the filter device 100 (broken line LN51). Accordingly, in the filter device 100H, the attenuation characteristic may further be improved as compared with the configuration of Preferred Embodiment 1.

When the line widths of the wiring patterns PT12 and PT15 are adjusted by changing the distance LG11 of the wiring patterns PT12 and PT15 from the end portion of the common electrode PC11 in the positive direction of the Y-axis (one ends of the wiring patterns PT11, PT14, and PT16), the shortest distance between the vias does not change. This makes it possible to change the inductance value between the resonators while maintaining the degree of magnetic coupling. Further, when the line widths of the wiring patterns PT12 and PT15 are adjusted by changing a distance LG12 of the wiring patterns PT12 and PT15 from the end portion of the common electrode PC11 in the negative direction of the Y-axis (the other ends of the wiring patterns PT11 and PT16), the shortest distance between the vias changes. This makes it possible to adjust the inductance value between the resonators in addition to change the strength of the magnetic coupling.

Further, when the distance LG13 between the via V53A and the via V54A is shortened, the distance between the resonators RC1 and RC4, the distance between the resonators RC2 and RC3, and the distance between the resonators RC3 and RC4 may be shortened. This makes it possible to strengthen the magnetic coupling between these resonators. Meanwhile, since the distance between the resonators RC1 and RC3, and the distance between the resonators RC2 and RC4 become longer, the magnetic coupling between these resonators becomes weaker, and the impedance at the input and output terminals changes. This change in impedance may be matched by adjusting the values of the capacitors (capacitors C13 and C24 in FIG. 19) between the resonators, for example.

Modification 5

Figure 23:
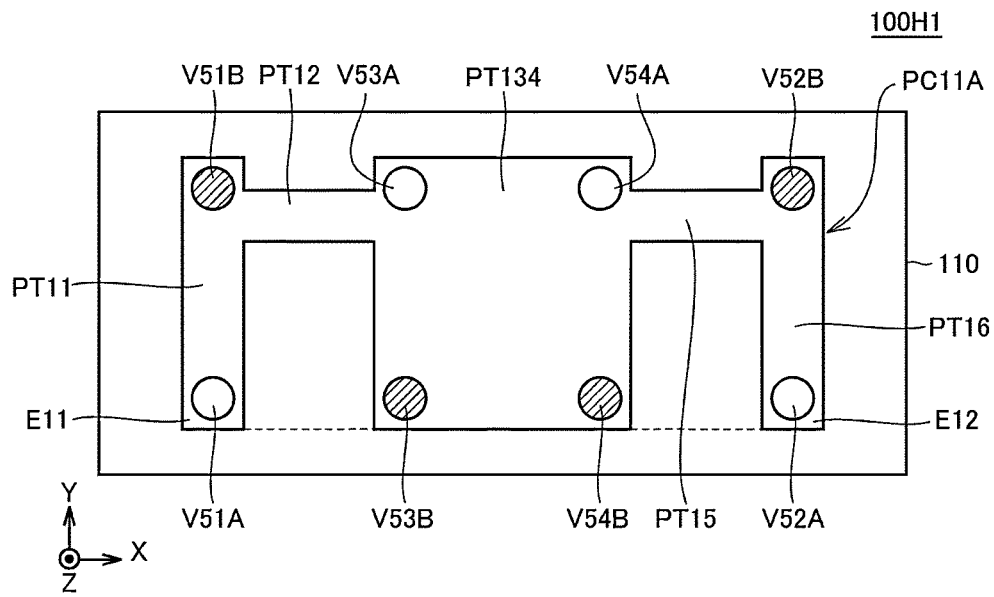
FIG. 23 is a plan view of a common electrode of a filter device of Modification 5 of a preferred embodiment of the present invention.

FIG. 23 is a plan view of a common electrode PC11A of a filter device 100H1 of Modification 5 of a preferred embodiment of the present invention. In the filter device 100H1, vias to connect the common electrode PC11A and the plate electrode PG11 are individually provided for the resonators RC3 and RC4.

More specifically, in the filter device 100H1, the wiring patterns PT13 and PT14 in FIG. 21 are configured as one wiring pattern P134, the inductors in the resonators RC3 and RC4 are not merged into one inductor, a via V53B is provided for the via V53A, and the via V53B is provided for the via V54A.

In the configuration of the filter device 100H1, since the magnetic coupling between the resonator RC3 and the resonator RC4 is weaker than that in the filter device 100H, the attenuation at the attenuation pole close to the pass band increases, but the pass band width slightly narrows. Which configuration of the filter device 100H and the filter device 100H1 to adopt is appropriately selected in consideration of a desired attenuation characteristic and pass band width.

Modification 6

Figure 24:
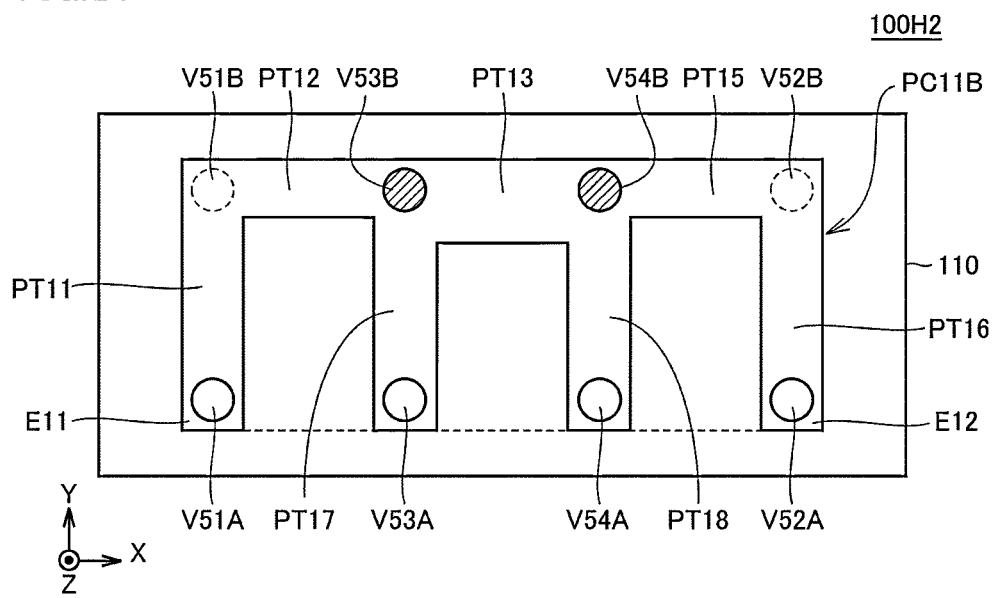
FIG. 24 is a plan view of a common electrode of a filter device of Modification 6 of a preferred embodiment of the present invention.

FIG. 24 is a plan view of a common electrode PC11B of a filter device 100H2 of Modification 6 of a preferred embodiment of the present invention. The common electrode PC11B includes the wiring patterns PT11, PT16, PT17, and PT18 extending along the short side (Y-axis) of the main body 110 and the wiring patterns PT12, PT13, and PT15 extending along the long side (X-axis) of the main body 110. The wiring pattern PT12 is connected between the wiring pattern PT11 and the wiring pattern PT17. The wiring pattern PT13 is connected between the wiring pattern PT17 and the wiring pattern PT18. The wiring pattern PT15 is connected between the wiring pattern PT18 and the wiring pattern PT16.

In the filter device 100H2, as compared with the filter device 100H1 of Modification 5 illustrated in FIG. 23, the position of the via V53A and the position of the via V53B of the resonator RC3 are interchanged, and the position of the via V54A and the position of the via V54B of the resonator RC4 are interchanged. Furthermore, in the filter device 100H2, the via V51B of the resonator RC1 is merged into the via V53B of the resonator RC3 and removed, and the via V52B of the resonator RC2 is merged into the via V54B of the resonator RC4 and removed.

That is, the vias V51A, V52A, V53A, and V54A connected to the ground terminal GND through the capacitors are respectively connected to the end portions of the wiring patterns PT11, PT16, PT17, PT18 in the negative direction of the Y-axis, and the vias V53B and V54B connected to the ground terminal GND without through the capacitor are respectively connected to the end portions of the wiring patterns PT17 and PT18 in the positive direction of the Y-axis.

In the configuration above, since the directions of magnetic lines of force generated in closed-loop coils configured by the wiring patterns and the vias of the resonators are the same, the magnetic coupling between the resonator RC1 and the resonator RC3 and the magnetic coupling between the resonator RC2 and the resonator RC4 are stronger than those in the configuration of the filter device 100H1 of Modification 5. With this, the attenuation on the higher frequency side relative to the pass band may be increased.

Whether to use the configuration in which the vias have the same arrangement as in the filter device 100H2 or whether to use the configuration in which the vias are arranged opposite to each other as in the filter device 100H1, between the resonators RC1 and RC3 and between the resonators RC2 and RC4, is appropriately selected based on the size or the like of the entire filter device, for example.

Specifically, when the size of a filter device, particularly the dimension in the Z-axis direction is relatively large, the length of a via becomes long, and an air core diameter of a coil in each resonator becomes large. With this, when vias of the resonators have the same arrangement as in the filter device 100H2 of Modification 6, the magnetic coupling may become excessive. In the case above, it is preferable to achieve a desired filter characteristic by adopting a configuration in which the vias are arranged opposite to each other as in the filter device 100H1 of Modification 5 to weaken the magnetic coupling.

Meanwhile, when the size of a filter device, particularly the dimension in the Z-axis direction is relatively small, the length of a via becomes short, and thus the magnetic coupling between resonators is likely to become weak. With this, it is preferable to achieve a desired filter characteristic by making the vias of the resonators have the same arrangement as in the filter device 100H2 of Modification 6 to strengthen the magnetic coupling.

Also in the filter device 100H2 of Modification 6, the degree of coupling between the resonators may be adjusted by adjusting the line widths of the wiring patterns PT12, PT13, and PT15.

Preferred Embodiment 4

In Preferred Embodiment 4 of the present invention, there will be described a configuration for reducing the influence of an external shield on a filter characteristic, the external shield which is disposed in a housing or the like of a communication device accommodating a filter device.

In each of the filter devices disclosed in the preferred embodiments described above, the common electrode is on the second layer LY2 on the uppermost side of the main body 110. Since the common electrode serves as a path of a current flowing in the resonator, the presence of an external shield on the upper surface side of the filter device causes the capacitive coupling to the external shield. This may become a factor of a variation in the filter characteristic.

As an example of a method of reducing the influence of the external shield, it is conceivable to increase the distance between the filter device and the external shield. However, in this case, ensuring the separation distance may become a factor that hinders the reduction of the communication device main body in size.

In a filter device of Preferred Embodiment 4, an internal shield connected to the ground terminal GND is disposed on a layer on a further upper surface side of the common electrode of the main body 110. As a result, variations in filter characteristic due to an external shield may be reduced or prevented.

Figure 25:
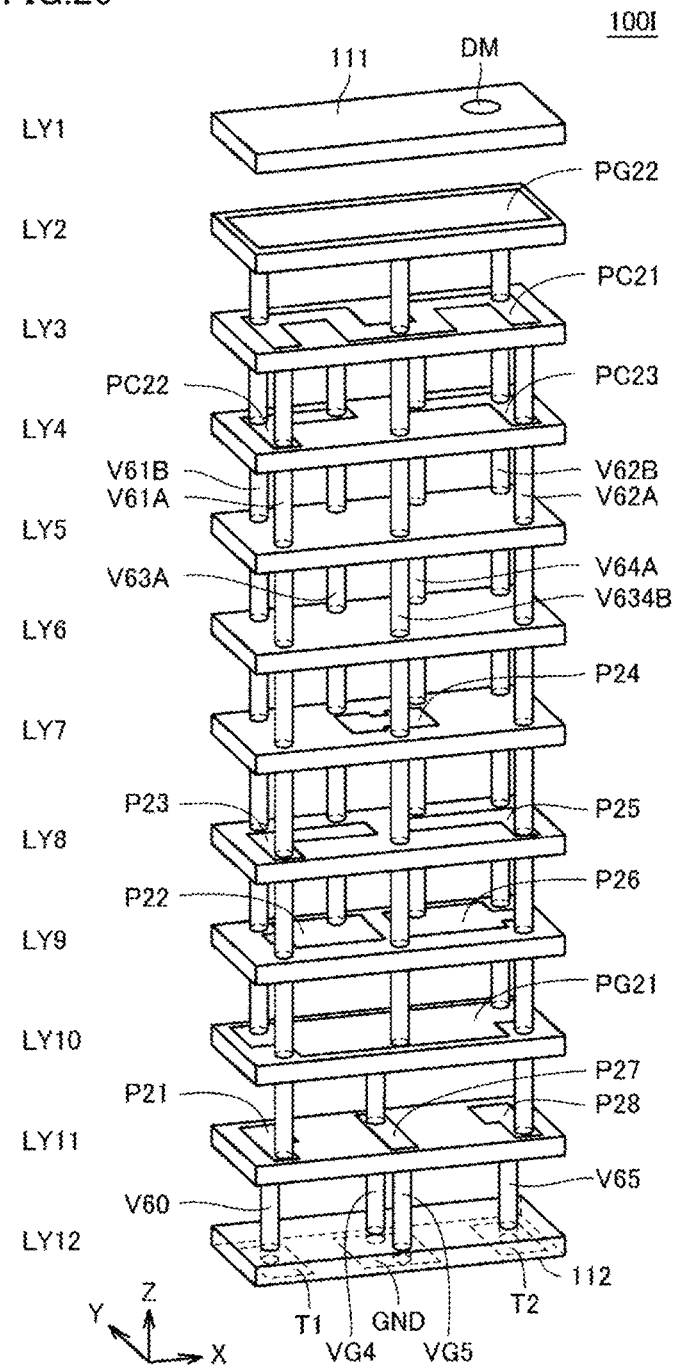
FIG. 25 is an exploded perspective view of a filter device of Preferred Embodiment 4 of the present invention illustrating an example of a multilayer structure thereof.

FIG. 25 is an exploded perspective view of a filter device 100I of Preferred Embodiment 4 illustrating an example of a multilayer structure thereof. Referring to FIG. 25, also in the filter device 100I, as in the filter device 100, the resonators RC1 to RC4 are defined in the main body 110 including the multiple dielectric layers LY1 to LY12. Note that the filter device 100I has a configuration in which the capacitor C34, in the equivalent circuit of the filter device 100H of Preferred Embodiment 3 illustrated in FIG. 19, is removed.

In the filter device 100I, the resonator RC1 is configured including vias V61A and V61B and a capacitor electrode P21. The resonator RC2 is configured including vias V62A and V62B, and a capacitor electrode P28. The resonator RC3 is configured including vias V63A and V634B, and a capacitor electrode P22. The resonator RC4 is configured including vias V64A and V634B, and a capacitor electrode P26.

The direction mark DM specifying the direction of the filter device 100 is on the upper surface 111 (first layer LY1) of the main body 110. Further, external terminals (input terminal T1, output terminal T2, and ground terminal GND) to connect to an external device are disposed on the lower surface 112 (twelfth layer LY12) of the main body 110.

The input terminal T1 is connected to the capacitor electrode P21 of the eleventh layer LY11 by a via V60. A portion of the capacitor electrode P21 opposes a plate electrode PG21 provided on the tenth layer LY10. The capacitor electrode P21 and the plate electrode PG21 define the capacitor C1 in FIG. 19.

The via V61A of the resonator RC1 is connected to the capacitor electrode P21. The via V61A is connected to a common electrode PC21 provided on the third layer LY3 and a common electrode PC22 provided on the fourth layer LY4. Further, the common electrodes PC21 and PC22 are connected to the plate electrode PG21 provided on the tenth layer LY10 by the via V61B. The plate electrode PG21 is connected to the ground terminal GND of the twelfth layer LY12 by the via VG4. Further, the via VG4 is also connected to a plate electrode P27 provided on the eleventh layer LY11. The plate electrode P27 is connected to the ground terminal GND by the vias VG4 and VG5.

The via V61A is connected to a capacitor electrode P23 of the eighth layer LY8. A portion of the capacitor electrode P23 opposes the capacitor electrode P22 of the ninth layer LY9. The capacitor electrodes P22 and P23 define the capacitor C13 in FIG. 19. Note that the via V61A and the via V61B respectively correspond to the inductor L1A and the inductor L1B in FIG. 19.

The output terminal T2 is connected to the capacitor electrode P28 of the eleventh layer LY11 by a via V65. A portion of the capacitor electrode P28 opposes the plate electrode PG21 provided on the twelfth layer LY12. The capacitor electrode P28 and the plate electrode PG21 define the capacitor C2 in FIG. 19.

The via V62A of the resonator RC2 is connected to the capacitor electrode P28. The via V62A is connected to the common electrode PC21 provided on the third layer LY3 and a common electrode PC23 provided on the fourth layer LY4. Further, the common electrodes PC21 and PC23 are connected to the plate electrode PG21 of the tenth layer LY10 by the via V62B.

Further, the via V62A is connected to a capacitor electrode P25 of the eighth layer LY8. A portion of the capacitor electrode P25 opposes the capacitor electrode P26 of the ninth layer LY9. The capacitor electrodes P25 and P26 define the capacitor C24 in FIG. 19. Note that the via V62A and the via V62B respectively correspond to the inductor L2A and the inductor L2B in FIG. 19.

The capacitor electrode P22 of the ninth layer LY9 is connected to the common electrode PC21 of the third layer LY3 and the common electrode PC22 of the fourth layer LY4 by the via V63A. Further, the common electrode PC21 is connected to the plate electrode PG21 of the tenth layer LY10 by the via V634B. The via V63A corresponds to the inductor L3A in FIG. 19. Further, the via V634B corresponds to the inductor L34B in FIG. 19.

The capacitor electrode P26 of the ninth layer LY9 is connected to the common electrode PC21 of the third layer LY3 and the common electrode PC23 of the fourth layer LY4 by the via V64A. Further, the common electrode PC21 is connected to the plate electrode PG21 of the tenth layer LY10 by the via V634B as described above. The via V64A corresponds to the inductor L4A in FIG. 19.

Further, a capacitor electrode P24 is further provided on the seventh layer LY7. The capacitor electrode P24 partially opposes the capacitor electrodes P23 and P25 of the eighth layer LY8. The capacitor electrodes P23 to P25 define the capacitor C12 in FIG. 19.

In the filter device 100I of Preferred Embodiment 4, a plate electrode PG22 is provided on the second layer LY2. The plate electrode PG22 covers at least the common electrode PC21 of the second layer LY3. In other words, when the main body 110 is viewed in plan in the lamination direction (Z-axis direction), the plate electrode PG22 overlaps the common electrode PC21.

The plate electrode PG22 is connected to the plate electrode PG21 (that is, ground terminal GND) through the vias V61B, V62B, and V634B. The plate electrode PG22 functions as an internal shield for the common electrode PC21. The plate electrode PG22 may prevent the common electrode PC21 from making capacitive coupling with an external shield (not illustrated) outside the filter device. Note that, in the example of FIG. 25, the plate electrode PG22 is connected to the plate electrode PG21 (that is, ground terminal GND) by three vias V61B, V62B, and V634B. The number of vias to connect the plate electrode PG21 and the plate electrode PG22 being large makes the electric potential of the plate electrode PG22 further be stabilized.

The common electrodes PC22 and PC23 of the fourth layer LY4 are provided to increase the Q factor at the input and output terminals. The insertion loss is improved by disposing the common electrodes PC22 and PC23.

FIG. 26 is a graph illustrating a bandpass characteristic of the filter device 100I in FIG. 25. In FIG. 26, the horizontal axis represents frequency, and the vertical axis represents insertion loss and return loss. In FIG. 26, solid lines LN60 and LN70 respectively illustrate the insertion loss and the return loss in the case of the filter device 100I of Preferred Embodiment 4, and broken lines LN61 and LN71 respectively illustrate the insertion loss and the return loss in the case that no internal shield is provided.

Referring to FIG. 26, the insertion loss in the pass band with the internal shield and the insertion loss in the pass band without the internal shield are substantially the same. However, particularly on a lower frequency side relative to the pass band, the insertion loss is larger in the filter device 100I with the internal shield, and the attenuation characteristic is improved. Further, the return loss in the pass band is decreased in the filter device 100I as compared with the case of no internal filter. Accordingly, it is understood that a decrease in the filter characteristic is reduced or prevented by providing the internal shield.

FIG. 27 is a table explaining the influence of an external shield on the filter characteristic depending on the presence or absence of the common electrode, and on the presence or absence of the internal shield. In FIG. 27, in each of Case 1 to Case 3, illustrated are the deterioration degree of the insertion loss in the pass band and the frequency of a point on a higher frequency side at which the attenuation becomes 20 dB (hereinafter, referred to as "attenuation point"), depending on the presence or absence of an external shield.

Case 1 is a case in which the common electrode is not provided, the resonators are independent, and the internal shield is not provided as in the comparative example in FIG. 6. Further, Case 2 is a case in which the common electrode is provided but the internal shield is not provided, and Case 3 is a case in which the common electrode and the internal shield are provided as in the filter device 100I of Preferred Embodiment 4.

Referring to FIG. 27, the insertion loss in the pass band is a decrease of approximately 0.30 dB in the cases without the internal shield (Case 1 and Case 2), but is improved to a decrease of approximately 0.06 dB in Case 3 with the internal shield.

Further, in Case 1, the frequency of the attenuation point on a higher frequency side of a case with an external shield is lower than that of a case without an external shield by 4 GHz or more. Meanwhile, in Case 2 and Case 3, the frequency of the attenuation point of a case with an external shield is higher than that of a case without an external shield by approximately 1 to 2 GHz. As described above, there is substantially no difference in the attenuation point depending on the presence or absence of the internal shield, but using the common electrode may reduce or prevent the variation in the attenuation point.

As described above, in the filter device 100I of Preferred Embodiment 4 including the common electrode and the internal shield, a decrease in the filter characteristic due to an external shield may be reduced or prevented.

In Preferred Embodiment 4, the common electrode PC21 may have a rectangular or substantially rectangular plate electrode, or may have a shape the same as or similar to that in the preferred embodiments and modifications described above. Further, although FIG. 24 illustrates an example in which the plate electrode PG22 is disposed as the internal shield only on the upper surface side, the internal shield may also be disposed on the side surface portions of the main body 110, in addition to that.

The preferred embodiments disclosed herein are illustrative and non-restrictive in all respects. It is intended that the scope of the present disclosure is indicated by the claims rather than the foregoing description of the preferred embodiments, and that all modifications within the meaning and scope of equivalency of the claims shall be embraced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device, comprising:
   an input terminal;
   an output terminal;
   a main body;
   a common electrode on the main body;
   a ground terminal; and
   a first LC parallel resonator, a second LC parallel resonator, and a third LC parallel resonator; wherein
   each of the first LC parallel resonator, the second LC parallel resonator, and the third LC parallel resonator is connected to the common electrode and the ground terminal;
   each of the first LC parallel resonator, the second LC parallel resonator, and the third LC parallel resonator includes:
      a capacitor;
      a first via including one end connected to the common electrode and another end connected to the ground terminal through the capacitor; and
      a second via including one end connected to the common electrode and another end connected to the ground terminal without through the capacitor; and
   the second via is connected between portions of the common electrode to which first vias of two adjacent LC parallel resonators of the first, second, and third LC parallel resonators are connected, each of the first vias being the first via including the one end connected to the common electrode and the other end connected to the ground terminal through the capacitor.

2. The filter device according to claim 1, wherein
   the common electrode has a strip-shape and includes a first end portion and a second end portion;
   the first via of the first LC parallel resonator is connected to the first end portion and is electrically connected to the input terminal;
   the first via of the second LC parallel resonator is connected to the second end portion and is electrically connected to the output terminal; and the third LC parallel resonator is located between the first LC parallel resonator and the second LC parallel resonator.

3. The filter device according to claim 2, further comprising a fourth LC parallel resonator between the second LC parallel resonator and the third LC parallel resonator.

4. The filter device according to claim 3, wherein
the common electrode has a meandering or serpentine shape;
the first via of the first LC parallel resonator, the second via of the first LC parallel resonator, the first via of the third LC parallel resonator, the second via of the third LC parallel resonator, the second via of the fourth LC parallel resonator, the first via of the fourth LC parallel resonator, the second via of the second LC parallel resonator, and the first via of the second LC parallel resonator are connected to the common electrode in this order from the first end portion toward the second end portion along the common electrode; and
at least one of a width of the common electrode between a portion to which the second via of the first LC parallel resonator is connected and a portion to which the first via of the third LC parallel resonator is connected, and a width of the common electrode between a portion to which the second via of the second LC parallel resonator is connected and a portion to which the first via of the fourth LC parallel resonator is connected is wider than a width of another portion of the common electrode.

5. The filter device according to claim 3, wherein
the common electrode has a meandering or serpentine shape;
the first via of the first LC parallel resonator, the second via of the first LC parallel resonator, the first via of the third LC parallel resonator, the second via of the third LC parallel resonator, the second via of the fourth LC parallel resonator, the first via of the fourth LC parallel resonator, the second via of the second LC parallel resonator, and the first via of the second LC parallel resonator are connected to the common electrode in this order from the first end portion toward the second end portion along the common electrode; and
a width of the common electrode between a portion to which the second via of the third LC parallel resonator is connected and a portion to which the second via of the fourth LC parallel resonator is connected is wider than a width of another portion of the common electrode.

6. The filter device according to claim 3, wherein
the common electrode includes a first portion between a portion to which the first LC parallel resonator is connected and a portion to which the third LC parallel resonator is connected; and
the first portion is connected between a portion to which the first via of the first LC parallel resonator is connected and a portion to which the second via of the first LC parallel resonator is connected, and between a portion to which the first via of the third LC parallel resonator is connected and a portion to which the second via of the third LC parallel resonator is connected.

7. The filter device according to claim 3, wherein
the common electrode includes a second portion between a portion to which the second LC parallel resonator is connected and a portion to which the fourth LC parallel resonator is connected; and the second portion is connected between a portion to which the first via of the second LC parallel resonator is connected and a portion to which the second via of the second LC parallel resonator is connected, and between a portion to which the first via of the fourth LC parallel resonator is connected and a portion to which the second via of the fourth LC parallel resonator is connected.

8. The filter device according to claim 3, further comprising:
a first capacitor connected between the first LC parallel resonator and the third LC parallel resonator;
a second capacitor connected between the second LC parallel resonator and the fourth LC parallel resonator; and
a third capacitor connected between the first LC parallel resonator and the second LC parallel resonator.

9. The filter device according to claim 3, wherein
the first via of the first LC parallel resonator, the second via of the first LC parallel resonator, the first via of the third LC parallel resonator, the first via of the fourth LC parallel resonator, the second via of the second LC parallel resonator, and the first via of the second LC parallel resonator are connected to the common electrode in this order from the first end portion toward the second end portion along the common electrode.

10. The filter device according to claim 3, wherein the first via of the first LC parallel resonator, the second via of the first LC parallel resonator, the first via of the third LC parallel resonator, the first via of the fourth LC parallel resonator, the second via of the second LC parallel resonator, and the first via of the second LC parallel resonator are arranged symmetrically with respect to a virtual line intersecting the common electrode.

11. The filter device according to claim 3, wherein the first via of the first LC parallel resonator, the second via of the first LC parallel resonator, the first via of the third LC parallel resonator, the first via of the fourth LC parallel resonator, the second via of the second LC parallel resonator, and the first via of the second LC parallel resonator are arranged to have rotational symmetry about a single point on the common electrode.

12. The filter device according to claim 1, further comprising:
a shield located closer to an upper surface side of the main body than the common electrode is, the shield being connected to the ground terminal; wherein
the shield overlaps the common electrode when viewed in plan from the upper surface side of the main body.

13. The filter device according to claim 1, wherein the filter device is a band pass filter that passes a signal in a specific frequency band.

14. A radio frequency front-end circuit comprising the filter device according to claim 1.

15. The filter device according to claim 1, wherein each of the first LC parallel resonator, the second LC parallel resonator, and the third LC parallel resonator includes an inductor connected in parallel with the capacitor.

16. The filter device according to claim 1, wherein the inductors of the first LC parallel resonator, the second LC parallel resonator, and the third LC parallel resonator are defined by two or more inductors connected in series.

17. The filter device according to claim 1, wherein the first LC parallel resonator and the second LC parallel resonator are connected to one another through a connecting capacitor.

18. The filter device according to claim 1, wherein the input terminal, the output terminal, and the ground terminal are regularly arranged on a lower surface of the main body.

19. The filter device according to claim 1, wherein the common electrode has a zigzag-shape and includes a first end portion and a second end portion.

20. The filter device according to claim 1, wherein the common electrode is E-shaped or substantially E-shaped.

\* \* \* \* \*